(12) United States Patent
Sakairi et al.

(10) Patent No.: US 11,990,455 B2
(45) Date of Patent: May 21, 2024

(54) SEMICONDUCTOR DEVICE

(71) Applicant: ROHM CO., LTD., Kyoto (JP)

(72) Inventors: Hiroyuki Sakairi, Kyoto (JP); Yusuke Nakakohara, Kyoto (JP); Ken Nakahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 302 days.

(21) Appl. No.: 17/596,060

(22) PCT Filed: Jun. 19, 2020

(86) PCT No.: PCT/JP2020/024058
§ 371 (c)(1),
(2) Date: Dec. 2, 2021

(87) PCT Pub. No.: WO2020/262212
PCT Pub. Date: Dec. 30, 2020

(65) Prior Publication Data
US 2022/0320054 A1     Oct. 6, 2022

(30) Foreign Application Priority Data

Jun. 24, 2019   (JP) .................... 2019-116622

(51) Int. Cl.
*H01L 25/16* (2023.01)
*H01L 23/00* (2006.01)
(Continued)

(52) U.S. Cl.
CPC .......... *H01L 25/16* (2013.01); *H01L 23/4951* (2013.01); *H01L 23/49562* (2013.01);
(Continued)

(58) Field of Classification Search
CPC .................. H01L 25/167; H01L 33/62; H01L 2224/0603; H01L 2224/48227;
(Continued)

(56) References Cited

U.S. PATENT DOCUMENTS

2015/0173248 A1   6/2015  Zeng
2020/0035656 A1   1/2020  Miyazaki et al.

FOREIGN PATENT DOCUMENTS

JP    2003-7967 A      1/2003
JP    2003-218309 A    7/2003
(Continued)

OTHER PUBLICATIONS

International Search Report issued in PCT/JP2020/024058, dated Sep. 8, 2020 (2 pages).

*Primary Examiner* — Robert G Bachner
(74) *Attorney, Agent, or Firm* — HSML P.C.

(57) ABSTRACT

A semiconductor device includes a conductive member including first, second and third conductors mutually spaced, a first semiconductor element having a first obverse surface provided with a first drain electrode, a first source electrode and a first gate electrode, and a second semiconductor element having a second obverse surface provided with a second drain electrode, a second source electrode and a second gate electrode. The first conductor is electrically connected to the first source electrode and the second drain electrode. The second conductor is electrically connected to the second source electrode. As viewed in a first direction crossing the first obverse surface, the second conductor is adjacent to the first conductor in a second direction crossing the first direction. The third conductor is electrically connected to the first drain electrode and is adjacent to the first conductor and the second conductor as viewed in the first direction.

25 Claims, 21 Drawing Sheets

(51) Int. Cl.
*H01L 23/495* (2006.01)
*H02M 1/08* (2006.01)
*H02M 3/00* (2006.01)

(52) U.S. Cl.
CPC .. *H01L 23/49575* (2013.01); *H01L 23/49589* (2013.01); *H01L 24/06* (2013.01); *H01L 24/38* (2013.01); *H01L 24/41* (2013.01); *H01L 24/49* (2013.01); *H01L 24/73* (2013.01); *H02M 1/08* (2013.01); *H02M 3/003* (2021.05); *H01L 24/40* (2013.01); *H01L 24/48* (2013.01); *H01L 2224/0603* (2013.01); *H01L 2224/06051* (2013.01); *H01L 2224/0615* (2013.01); *H01L 2224/38* (2013.01); *H01L 2224/4009* (2013.01); *H01L 2224/40106* (2013.01); *H01L 2224/40245* (2013.01); *H01L 2224/41175* (2013.01); *H01L 2224/48108* (2013.01); *H01L 2224/48137* (2013.01); *H01L 2224/48245* (2013.01); *H01L 2224/4903* (2013.01); *H01L 2224/49112* (2013.01); *H01L 2224/4912* (2013.01); *H01L 2224/49175* (2013.01); *H01L 2224/73221* (2013.01); *H01L 2924/10272* (2013.01); *H01L 2924/10329* (2013.01); *H01L 2924/1033* (2013.01); *H01L 2924/1067* (2013.01); *H01L 2924/13055* (2013.01); *H01L 2924/13064* (2013.01); *H01L 2924/13091* (2013.01)

(58) Field of Classification Search
CPC .......... H01L 2224/49111; H05B 45/40; H05B 45/3725; H05K 1/181; H05K 2201/10015; H05K 2201/10053; H05K 2201/10106; H05K 1/0243; H05K 1/113; H05K 2201/0792; H05K 2201/10166; G01S 7/4814; G01S 17/10
See application file for complete search history.

(56) References Cited

FOREIGN PATENT DOCUMENTS

| | | |
|---|---|---|
| JP | 2004-342735 A | 12/2004 |
| JP | 2016-111088 A | 6/2016 |
| WO | 2018/186353 A1 | 10/2018 |

SEMICONDUCTOR DEVICE

TECHNICAL FIELD

The present disclosure relates to a semiconductor device with a plurality of semiconductor elements.

BACKGROUND ART

A semiconductor device having a plurality of semiconductor elements molded in a single resin package is conventionally known. Such a semiconductor device may be called "System in Package". Patent Document 1 discloses a semiconductor device with two switching elements and a control IC integrated into a single package. The control IC is a semiconductor element for controlling the switching elements. Each switching element performs switching operation in response to signals from the control IC. This type of semiconductor device may be mounted on a circuit board of an electronic device and used in a power supply circuit for a DC/DC converter, for example.

TECHNICAL REFERENCE

Patent Document

Patent Document 1: JP-A-2003-218309

SUMMARY OF THE INVENTION

Problems to be Solved by the Invention

With the recent trend for energy saving and improved performance of electronic devices, semiconductor devices are demanded to achieve reduced power consumption and improved responsiveness of switching operations. Reducing parasitic inductance and parasitic resistance is an effective way to reduce power consumption and improve the responsiveness of switching operations.

In light of the above circumstances, an object of the present disclosure is to provide a semiconductor device with a plurality of semiconductor elements integrated into a single package which is configured to reduce parasitic inductance and parasitic resistance.

Means for Solving the Problems

A semiconductor device provided according to the present disclosure includes a conductive member including a first conductor, a second conductor and a third conductor that are spaced apart from each other, a first semiconductor element having a first obverse surface on which a first drain electrode, a first source electrode and a first gate electrode are disposed, and a second semiconductor element having a second obverse surface on which a second drain electrode, a second source electrode and a second gate electrode are disposed. The semiconductor device is characterized in that: the first conductor is electrically connected to the first source electrode and the second drain electrode; the second conductor is electrically connected to the second source electrode, and as viewed in a first direction orthogonal to the first obverse surface, the second conductor is adjacent to the first conductor in a second direction orthogonal to the first direction; and the third conductor is electrically connected to the first drain electrode and is adjacent to each of the first conductor and the second conductor as viewed in the first direction.

Advantages of the Invention

According to the present disclosure, parasitic inductance and parasitic resistance can be reduced in a semiconductor device with a plurality of semiconductor elements integrated in a single package.

MODE FOR CARRYING OUT THE INVENTION

Preferred embodiments of a semiconductor device of the present disclosure are described below with reference to the accompanying drawings. The same or similar elements are denoted by the same reference signs, and the description thereof is omitted.

In the present disclosure, the phrase "an object A overlaps with an object B as viewed in a certain direction" includes, unless otherwise specified, "the object A overlaps with the entirety of the object B as viewed in a certain direction" and "the object A overlaps with a portion of the object B as viewed in a certain direction". In the present disclosure, the terms such as "first", "second", and "third" are used merely as labels and are not necessarily intended to order the objects.

A semiconductor device A1 according to a first embodiment is described below with reference to FIGS. 1-11. The semiconductor device A1 may be used in a power conversion device such as an inverter or a converter, for example.

FIGS. 1-8 show the module structure of the semiconductor device A1 according to the first embodiment. The semiconductor device A1 includes, in its module structure, two semiconductor elements 1 and 2, a control element 3, a lead frame 4, a plurality of wires 5A-5L and a sealing member 6. In the semiconductor device A1, the lead frame 4 includes a plurality of leads 4A-4H that are separated from each other.

Figure 1:
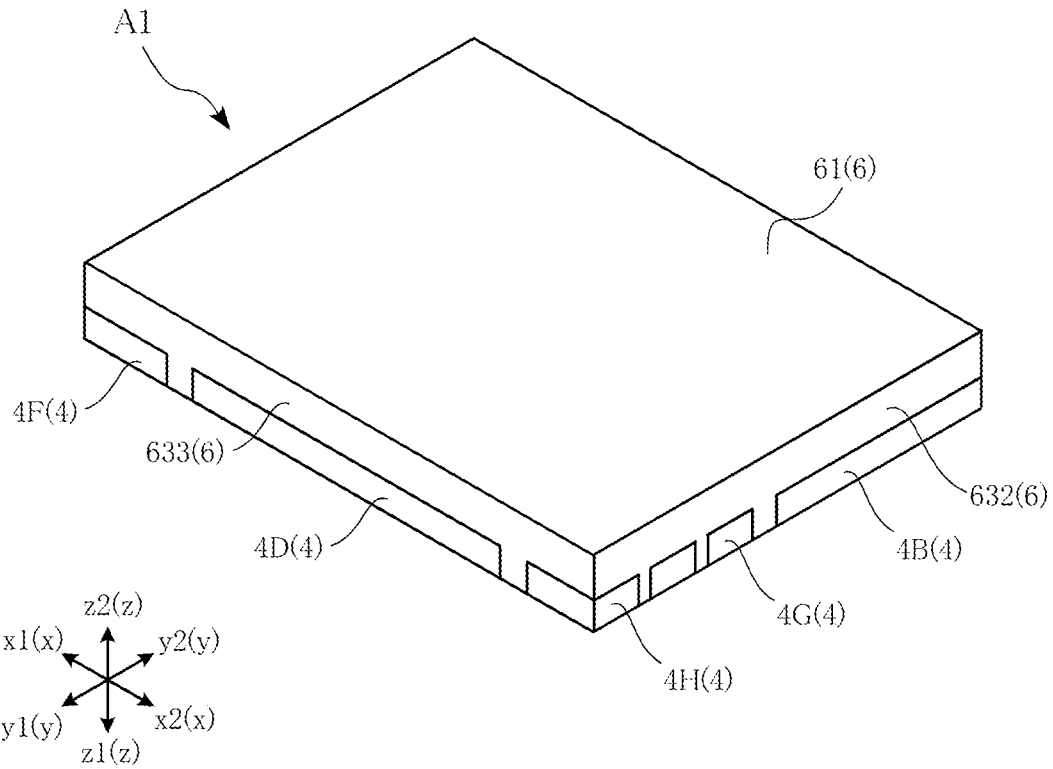
FIG. 1 is a perspective view of a semiconductor device according to a first embodiment.
Figure 2:
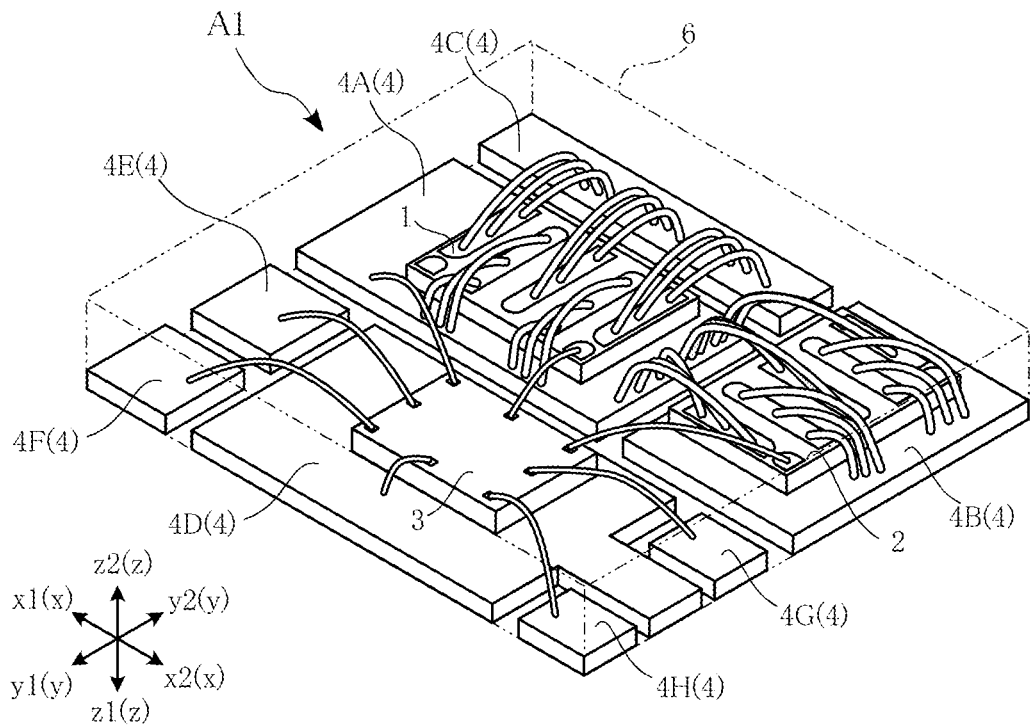
FIG. 2 is a perspective view corresponding to FIG. 1, in which the sealing member is shown by imaginary lines (two-dot chain lines)
Figure 3:
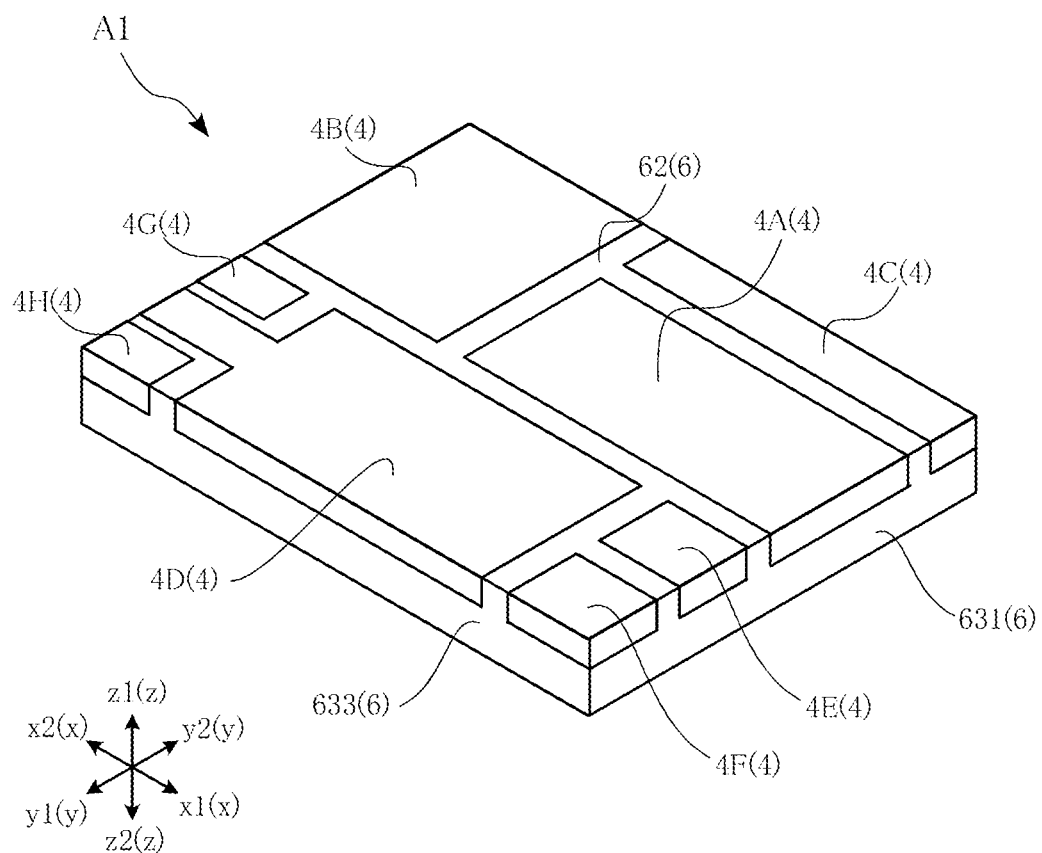
FIG. 3 is a perspective view (as seen from the bottom side) of the semiconductor device according to the first embodiment.
Figure 4:
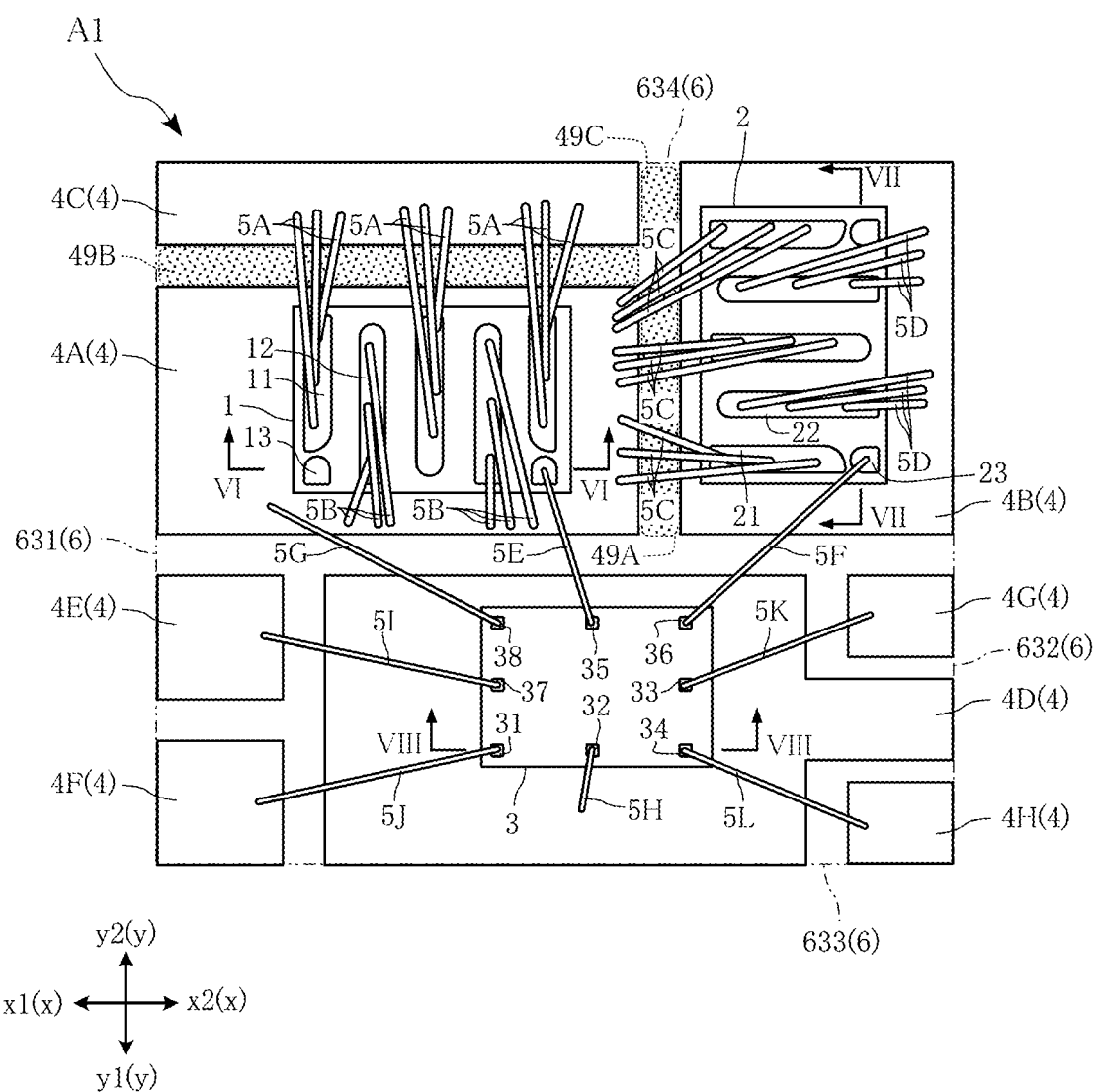
FIG. 4 is a plan view of the semiconductor device according to the first embodiment.
Figure 5:
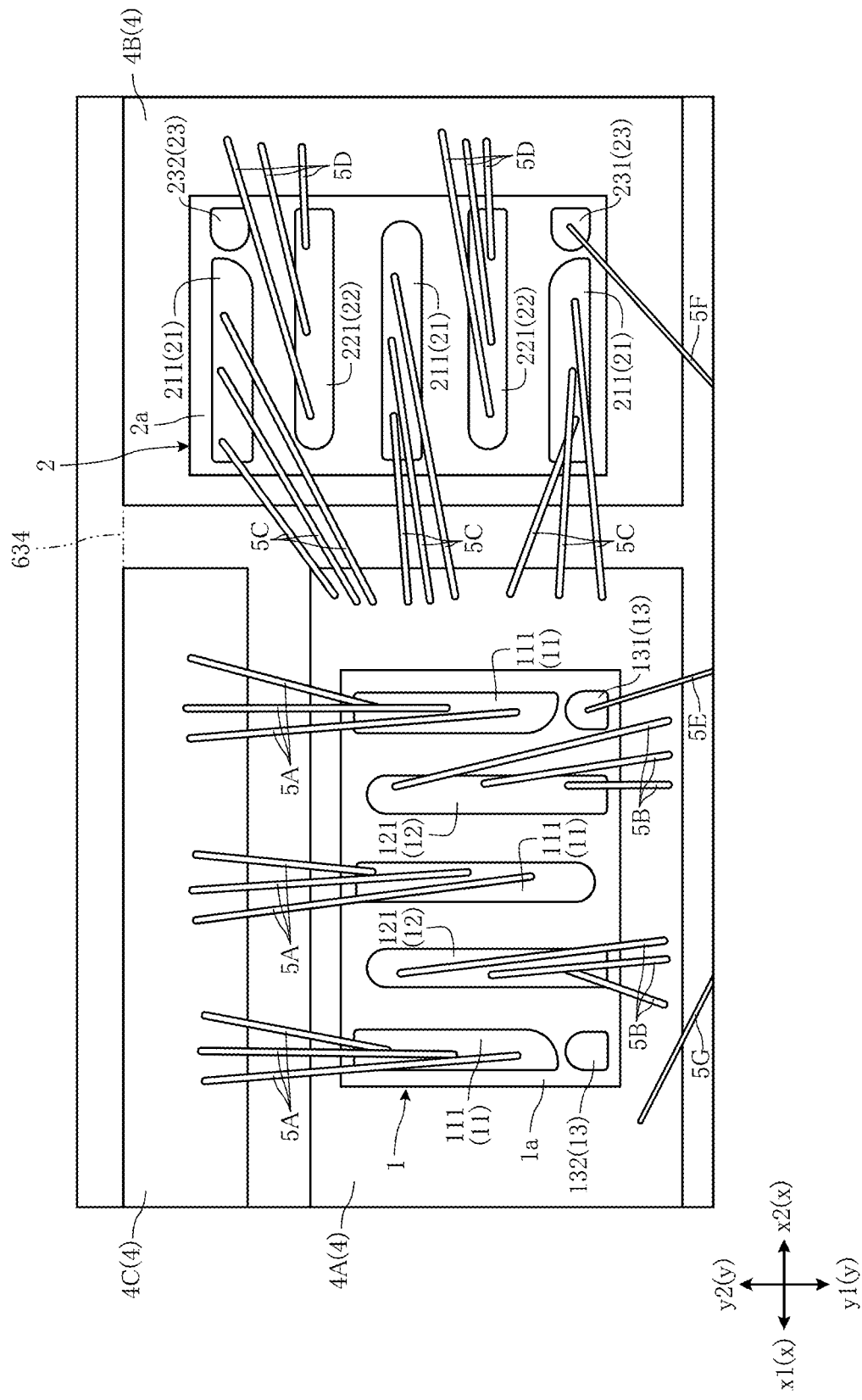
FIG. 5 is an enlarged view showing a part of the plan view of FIG. 4.
Figure 7:
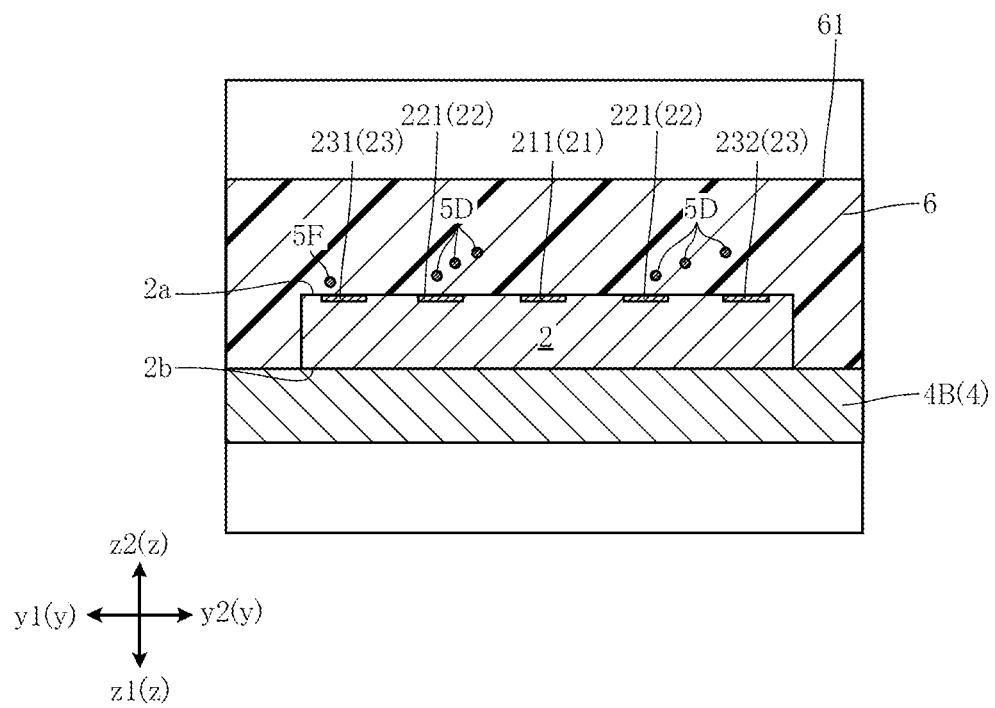
FIG. 7 is a sectional view taken along line VII-VII in FIG. 4.
Figure 8:
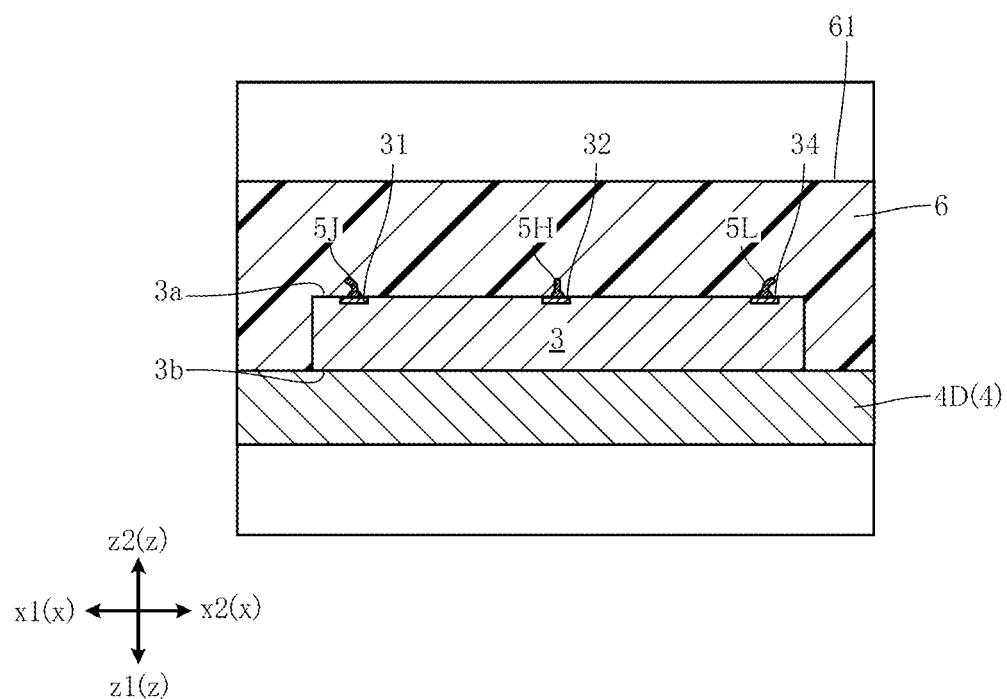
FIG. 8 is a sectional view taken along line VIII-VIII in FIG. 4.

FIG. 1 is a perspective view of the semiconductor device A1. FIG. 2 is a perspective view corresponding to FIG. 1, in which the sealing member 6 is shown by imaginary lines (two-dot chain lines). FIG. 3 is a perspective view of the semiconductor device A1 as seen from the bottom side. FIG. 4 is a plan view of the semiconductor device A1, in which the sealing member 6 is shown by imaginary lines (two-dot chain lines). FIG. 5 is an enlarged view of a part of FIG. 4. FIG. 5 is a sectional view taken along line VI-VI in FIG. 4. FIG. 7 is a sectional view taken along line VII-VII in FIG. 4. FIG. 8 is a sectional view taken along line VIII-VIII in FIG. 4.

For convenience of description, the three directions that are orthogonal to each other are defined as x direction, y direction, and z direction. The z direction is the thickness direction of the semiconductor device A1. The x direction is the horizontal direction in the plan view of the semiconductor device A1 (see FIG. 4). The y direction is the vertical direction in the plan view of the semiconductor device A1 (see FIG. 4). One sense of the x direction is referred to as x1 direction, and the other sense of the x direction is referred to as x2 direction. Similarly, one sense of the y direction is referred to as y1 direction, and the other sense of the y direction is referred to as y2 direction. Also, one sense of the z direction is referred to as z1 direction, and the other sense of the z direction is referred to as z2 direction. In the present disclosure, the z1 direction may be referred to as "down", and the z2 direction may be referred to as "up". The z direction may correspond to the "first direction", the x direction to the "second direction", and the y direction to the "third direction" recited in the claims.

The semiconductor device A1 may be mounted on a circuit board of an electronic device, for example. The semiconductor device A1 has a surface-mount-type package structure, and in this embodiment, of a package type called SON (Small Outline Non-lead).

The two semiconductor elements 1 and 2 are both the elements that perform the electrical functions of the semiconductor device A1. The semiconductor elements 1 and 2 each are a switching element, and a MOSFET in the present disclosure. Each of the semiconductor elements 1 and 2 is not limited to a MOSFET, but may be a field-effect transistor including a MISFET (Metal-Insulator-Semiconductor FET) and a HEMT (High Electron Mobility Transistor), a bipolar transistor, or other transistors such as an IGBT (Insulated Gate Bipolar Transistor). The semiconductor devices 1 and 2 each may be an n-type MOSFET or may be a p-type MOSFET. The semiconductor elements 1 and 2 each are preferably of a trench gate type, but may be of a planar gate type.

As shown in FIG. 4, the semiconductor elements 1 and 2 each may be rectangular as viewed in plan (as viewed in the z direction). As shown in FIGS. 2 and 4, the semiconductor element 1 is mounted on the lead 4A, and the semiconductor element 2 is mounted on the lead 4B. Each of the semiconductor elements 1 and 2 may be made of GaN (gallium nitride), for example. The material for the semiconductor elements 1 and 2 is not limited to GaN, and examples of the material may include SiC (silicon carbide), Si (silicon), GaAs (gallium arsenide) and $Ga_2O_3$ (gallium oxide). The semiconductor element 1 may correspond to the "first semiconductor element" and the semiconductor element 2 to the "second semiconductor element" recited in the claims.

Figure 6:
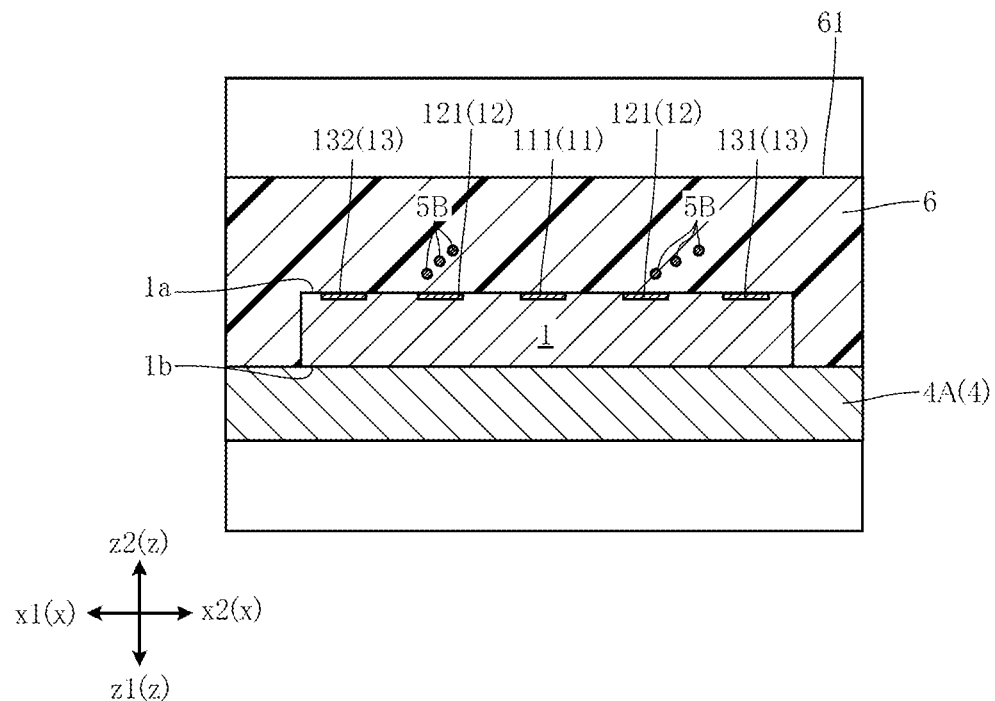
FIG. 6 is a sectional view taken along line VI-VI in FIG. 4.

As shown in FIG. 6, the semiconductor element 1 has an element obverse surface 1a and an element reverse surface 1b. The element obverse surface 1a and the element reverse surface 1b are spaced apart from each other in the z direction. The element obverse surface 1a faces in the z2 direction, and the element reverse surface 1b faces in the z1 direction. In the present example, the element obverse surface 1a and the element reverse surface 1b are orthogonal to the z direction. The element reverse surface 1b faces the lead 4A. The element obverse surface 1a may correspond to the "first obverse surface" and the element reverse surface 1b to the "first reverse surface" recited in the claims.

The semiconductor element 1 is a three-terminal element with three electrodes. In the present embodiment, as shown in FIGS. 4, 5 and 6, the semiconductor element 1 has a drain electrode 11, a source electrode 12 and a gate electrode 13. As shown in FIG. 6, the drain electrode 11, the source electrode 12 and the gate electrode 13 are disposed on the element obverse surface 1a. The drain electrode 11 may correspond to the "first drain electrode", the source electrode 12 to the "first source electrode", and the gate electrode 13 to the "first gate electrode" recited in the claims.

As shown in FIG. 5, the drain electrode 11 includes a plurality of pad portions 111. Each pad portion 111 is in the form of a strip extending in a first extension direction. In the example shown in FIG. 5, each pad portion 111 extends in the y direction, so that the first extension direction and the y direction generally correspond to each other. Each pad portion 111 is electrically connected to a drain region inside the semiconductor element 1. The pad portions 111 may correspond to the "first drain pad portion" recited in the claims.

As shown in FIG. 5, the source electrode 12 includes a plurality of pad portions 121. As with the pad portions 111, each pad portion 121 is in the form of a strip extending in the first extension direction. In the example shown in FIG. 5, each pad portion 121 extends in the y direction. Each pad portion 121 is electrically connected to a source region inside the semiconductor element 1. The pad portions 121 may correspond to the "first source pad portion" recited in the claims.

The pad portions 111 and the pad portion 121 are arranged side by side in a first arrangement direction and alternately arranged. The first arrangement direction is generally orthogonal to the first extension direction. Thus, when the first extension direction corresponds to the y direction, the first arrangement direction generally corresponds to the x direction.

As shown in FIG. 5, the gate electrode 13 includes two pad portions 131 and 132. Each of the pad portions 131 and 132 is electrically connected to a gate region (channel region) inside the semiconductor element 1. The two pad portions 131 and 132 are disposed near the edge of the element obverse surface 1a on the y1 side and spaced apart from each other in the x direction. In the example shown in FIG. 5, as viewed in plan, the pad portion 131 is disposed at the corner where the x2 side and the y1 side meet. The pad portion 132 is disposed at the corner where the x1 side and the y1 side meet. The two pad portions 131 and 132 are at the same potential. Note that the gate electrode 13 may not include the pad portion 132.

The semiconductor element 1 receives a drive signal from the control element 3 and switches between a conducting state and a blocked state in response to the drive signal (i.e., performs switching operation). Such a drive signal is input to the gate electrode 13 (pad portion 131) via a wire 5E.

As shown in FIG. 7, the semiconductor element 2 has an element obverse surface 2a and an element reverse surface 2b. The element obverse surface 2a and the element reverse surface 2b are spaced apart from each other in the z direction. The element obverse surface 2a faces in the z2 direction, and the element reverse surface 2b faces in the z1 direction. In the present example, the element obverse surface 2a and the element reverse surface 2b are orthogonal to the z direction. The element reverse surface 2b faces the lead 4B. The element obverse surface 2a may correspond to the "second obverse surface" and the element reverse surface 2b to the "second reverse surface" recited in the claims.

The semiconductor element 2 is a three-terminal element with three electrodes. In the present embodiment, as shown in FIGS. 4, 5 and 7, the semiconductor element 2 has a drain electrode 21, a source electrode 22 and a gate electrode 23. As shown in FIG. 7, the drain electrode 21, the source electrode 22 and the gate electrode 23 are disposed on the element obverse surface 2a. The drain electrode 21 may correspond to the "second drain electrode", the source electrode 22 to the "second source electrode", and the gate electrode 23 to the "second gate electrode" recited in the claims.

As shown in FIG. 5, the drain electrode 21 includes a plurality of pad portions 211. Each pad portion 211 is in the form of a strip extending in a second extension direction. The second extension direction is inclined by not less than 10° and not more than 170° with respect to the first extension direction. That is, the angle defined by the first extension direction and the second extension direction is not less than 10° and not more than 170°. In the example shown in FIG. 5, each pad portion 211 extends in the x direction, so that the second extension direction and the x direction generally correspond to each other. That is, in the example shown in FIG. 5, the angle defined by the first extension direction and the second extension direction is about 90°. Each pad portion 211 is electrically connected to a drain region inside the semiconductor element 2. The pad portions 211 may correspond to the "second drain pad portion" recited in the claims.

As shown in FIG. 5, the source electrode 22 includes a plurality of pad portions 221. As with the pad portions 211, each pad portion 221 is in the form of a strip extending in the second extension direction. In the example shown in FIG. 5, each pad portion 221 extends in the x direction. Each pad portion 221 is electrically connected to a source region inside the semiconductor element 2. The pad portions 221 correspond to the "second source pad portion" recited in the claims.

The pad portions 211 and the pad portion 221 are arranged side by side in a second arrangement direction and alternately arranged. The second arrangement direction is generally orthogonal to the second extension direction. Thus, when the second extension direction generally corresponds to the x direction, the second arrangement direction generally corresponds to the y direction.

As shown in FIG. 5, the gate electrode 23 includes two pad portions 231 and 232. Each of the pad portions 231 and 232 is electrically connected to a gate region (channel region) inside the semiconductor element 2. The two pad portions 231 and 232 are disposed near the edge of the element obverse surface 2a on the x2 side and spaced apart from each other in the y direction. In the example shown in FIG. 5, as viewed in plan, the pad portion 231 is disposed at the corner where the x2 side and the y1 side meet. The pad portion 232 is disposed at the corner where the x2 side and the y2 side meet. The two pad portions 231 and 232 are at the same potential. Note that the gate electrode 23 may not include the pad portion 232.

The semiconductor element 2 receives a drive signal from the control element 3 and switches between a conducting state and a blocked state in response to the drive signal (i.e., performs switching operation). Such a drive signal is input to the gate electrode 23 (pad portion 231) via a wire 5F.

The control element 3 controls the switching operations of the two semiconductor elements 1 and 2. The control element 3 generates a drive signal to drive each of the semiconductor elements 1 and 2, and outputs the generated drive signal to each of the semiconductor elements 1 and 2. The control element 3 is, for example, an IC (integrated circuit). The control element 3 is a semiconductor element made of a semiconductor material. As shown in FIGS. 2 and 4, the control element 3 is mounted on the lead 4D. In the example shown in FIG. 4, the control element 3 overlaps with a portion of the semiconductor element 1 and a portion of the semiconductor element 2, as viewed in the y direction.

As shown in FIG. 8, the control element 3 has an element obverse surface 3a and an element reverse surface 3b. The element obverse surface 3a and the element reverse surface 3b are spaced apart from each other in the z direction. The element obverse surface 3a faces in the z2 direction, and the element reverse surface 3b faces in the z1 direction. The element reverse surface 3b faces the lead 4D.

As shown in FIG. 4, the control element 3 has a plurality of element electrodes 31-38. The element electrodes 31-38 are disposed on the element obverse surface 3a. Each of the element electrodes 31-38 is an input end or an output end of the control element 3. The arrangement of each of the element electrodes 31-38 as viewed in plan is not limited to the example shown in FIG. 4.

As shown in FIG. 4, the element electrode 31 has one end of a wire 5J bonded thereto and is electrically connected to the lead 4F via the wire 5J.

As shown in FIG. 4, the element electrode 32 has one end of a wire 5H bonded thereto and is electrically connected to the lead 4D via the wire 5H.

As shown in FIG. 4, the element electrode 33 has one end of a wire 5K bonded thereto and is electrically connected to the lead 4G via the wire 5K.

As shown in FIG. 4, the element electrode 34 has one end of a wire 5L bonded thereto and is electrically connected to the lead 4H via the wire 5L.

As shown in FIG. 4, the element electrode 35 has one end of a wire 5E bonded thereto and is electrically connected to the gate electrode 13 (pad portion 131) of the semiconductor element 1 via the wire 5E. The drive signal (first drive signal) to control the switching operation of the semiconductor element 1 is output from the element electrode 35.

The element electrode 35 may correspond to the "first element electrode" recited in the claims.

As shown in FIG. 4, the element electrode 36 has one end of a wire 5F bonded thereto and is electrically connected to the gate electrode 23 (pad portion 231) of the semiconductor element 2 via the wire 5F. The drive signal (second drive signal) to control the switching operation of the semiconductor element 2 is output from the element electrode 36. The element electrode 36 may correspond to the "second element electrode" recited in the claims.

As shown in FIG. 4, the element electrode 37 has one end of a wire 5I bonded thereto and is electrically connected to the lead 4E via the wire 5I.

As shown in FIG. 4, the element electrode 38 has one end of a wire 5G bonded thereto and is electrically connected to the lead 4A via the wire 5G.

The two semiconductor elements 1 and 2 and the control element 3 are mounted on the lead frame 4. The lead frame 4, together with the wires 5A-5L, forms a conduction path in the semiconductor device A1. The lead frame 4 is made of a conductive material. The material for the lead frame 4 may be a metal containing copper (Cu), for example. Note that the material may be metals other than Cu. Plating may be applied to the surfaces of the lead frame 4, as desired. As shown in FIG. 4, the lead frame 4 includes a plurality of leads 4A-4H spaced apart from each other. As shown in FIG. 3, each of the leads 4A-4H is partially exposed from the sealing member 6, and the exposed portions serve as terminals in mounting the semiconductor device A1 on an external circuit board (e.g. a circuit board B1 described later).

As shown in FIG. 4, the semiconductor element 1 is mounted on the lead 4A. The lead 4A has one end of each of the wires 5B bonded thereto and is electrically connected to the source electrode 12 of the semiconductor element 1 via the wires 5B. The lead 4A also has one end of each of the wires 5C bonded thereto and is electrically connected to the drain electrode 21 of the semiconductor element 2 via the wires 5C. Also, the lead 4A has one end of a wire 5G bonded thereto and is electrically connected to the element electrode 38 of the control element 3 via the wire 5G.

As shown in FIG. 4, the semiconductor element 2 is mounted on the lead 4B. The lead 4B has one end of each of the wires 5D bonded thereto and is electrically connected to the source electrode 22 of the semiconductor element 2 via the wires 5D.

As shown in FIG. 4, the lead 4C has one end of each of the wires 5D bonded thereto and is electrically connected to the drain electrode 11 of the semiconductor element 1 via the wires 5A.

As shown in FIG. 4, the control element 3 is mounted on the lead 4D. The lead 4D has one end of a wire 5H bonded thereto and is electrically connected to the element electrode 32 of the control element 3 via the wire 5H.

As shown in FIG. 4, the lead 4E has one end of a wire 5I bonded thereto and is electrically connected to the element electrode 37 of the control element 3 via the wire 5I.

As shown in FIG. 4, the lead 4F has one end of a wire 5J bonded thereto and is electrically connected to the element electrode 31 of the control element 3 via the wire 5J.

As shown in FIG. 4, the lead 4G has one end of a wire 5K bonded thereto and is electrically connected to the element electrode 33 of the control element 3 via the wire 5K.

As shown in FIG. 4, the lead 4H has one end of a wire 5L bonded thereto and is electrically connected to the element electrode 34 of the control element 3 via the wire 5L.

In the lead frame 4, as shown in FIG. 4, the leads 4A-4H have the positional relationship described below.

As viewed in plan, the lead 4A and the lead 4B are adjacent to each other in the x direction. An insulating region 49A (indicated by dots in FIG. 4 for convenience of understanding) is provided between the lead 4A and the lead 4B. The lead 4A and the lead 4B overlap with each other as viewed in the x direction. The insulating region 49A may correspond to the "second insulating region" recited in the claims.

As viewed in plan, the lead 4A and the lead 4C are adjacent to each other in the y direction. An insulating region 49B (indicated by dots in FIG. 4 for convenience of understanding) is provided between the lead 4A and the lead 4C. The lead 4A and the lead 4C overlap with each other as viewed in the y direction. The insulating region 49B may correspond to the "first insulating region" recited in the claims.

As viewed in plan, the lead 4B and the lead 4C are adjacent to each other in the x direction. An insulating region 49C (indicated by dots in FIG. 4 for convenience of understanding) is provided between the lead 4B and the lead 4C. The lead 4B and the lead 4C overlap with each other as viewed in the x direction.

The lead 4C is aligned with the semiconductor element 1 in the first extension direction, and the lead 4A is aligned with the semiconductor element 2 in the second extension direction.

Both of the lead 4A and the lead 4B are disposed on the y2 side of the lead 4D. The lead 4A and the lead 4B both overlap with the lead 4D as viewed in the y direction and do not overlap with the lead 4D as viewed in the x direction.

The lead 4E, the lead 4F, the lead 4G and the lead 4H each overlap with the lead 4D as viewed in the x direction. The lead 4E and the lead 4F overlap with the lead 4A and the lead 4C as viewed in the y direction, and the lead 4G and the lead 4H overlap with the lead 4B as viewed in the y direction. The lead 4E and the lead 4G overlap with each other as viewed in the x direction, and the lead 4F and the lead 4H overlap with each other as viewed in the x direction. The lead 4D has a projection that projects in the x2 direction, and the projection is located between the lead 4G and the lead 4H in the y direction.

In the lead frame 4, the lead 4C, the lead 4A, the lead 4E and the lead 4F are aligned in the mentioned order along the edge on the x1 side. The lead 4B, the lead 4G, the above-mentioned projection of the lead 4D and the lead 4H are aligned in the mentioned order along the edge on the x2 side. Also, in the lead frame 4, the lead 4F, the lead 4D and the lead 4H are aligned in the mentioned order along the edge on the y1 side, and the lead 4C and the lead 4B are aligned in the mentioned order along the edge on the y2 side.

In the present embodiment, the lead frame 4 may correspond to the "conductive member" recited in the claims. The lead 4A may correspond to the "first conductor" recited in the claims. The lead 4B may correspond to the "second conductor" recited in the claims. The lead 4C may correspond to the "third conductor" recited in the claims. The lead 4D may correspond to the "fourth conductor" recited in the claims. The lead 4E may correspond to the "fifth conductor" recited in the claims. The lead 4F may correspond to the "sixth conductor" recited in the claims. The lead 4G may correspond to the "seventh conductor" recited in the claims. The lead 4H may correspond to the "eighth conductor" recited in the claims.

The wires 5A-5L each electrically connect two separated members. The wires 5A-5L each are a bonding wire. The wires 5A-5L each are made of a conductive material. The material for the wires 5A-5L may be a metal containing Au (gold), a metal containing Al (aluminum), or a metal containing Cu, for example. The wire diameters (thicknesses) of the wires 5A-5D are larger than the wire diameters (thicknesses) of the wires 5E-5L in the example shown in FIG. 4, but may be the equal to or smaller than the wire diameters of the wires 5E-5L. The number of the wires 5A-5L is not limited to that shown in FIG. 2 and may vary as appropriate, depending on the configurations (the size in plan view, arrangement, number, etc.) of the pad portions 111, 121, 131, 132, 211, 221, 231, 232 and element electrodes 31-38, the wire diameters of the wires 5A-5L, and the amount of current flowing through the wires 5A-5L, for example.

As shown in FIGS. 4 and 5, each of the wires 5A has one end bonded to the drain electrode 11 (one of the pad portions 111) of the semiconductor element 1 and the other end bonded to the lead 4C. In the example shown in FIGS. 4 and 5, three wires 5A are bonded to each of the three pad portions 111. Each wire 5A electrically connects the drain electrode 11 (each pad portion 111) and the lead 4C. As shown in FIG. 4, each wire 5A overlaps with the insulating region 49B, as viewed in plan.

As shown in FIGS. 4 and 5, each of the wires 5B has one end bonded to the source electrode 12 (one of the pad portions 121) of the semiconductor element 1 and the other end bonded to the lead 4A. In the example shown in FIGS. 4 and 5, three wires 5B are bonded to each of the two pad portions 121. Each wire 5B electrically connects the source electrode 12 (each pad portion 121) and the lead 4A.

As shown in FIGS. 4 and 5, each of the wires 5C has one end bonded to the drain electrode 21 (one of the pad portions 211) of the semiconductor element 2 and the other end bonded to the lead 4A. In the example shown in FIGS. 4 and 5, three wires 5C are bonded to each of the three pad portions 211. Each wire 5C electrically connects the drain electrode 21 (each pad portion 211) and the lead 4A. As shown in FIG. 4, each wire 5C overlaps with the insulating region 49A, as viewed in plan.

As shown in FIGS. 4 and 5, each of the wires 5D has one end bonded to the source electrode 22 (one of the pad portions 221) of the semiconductor element 2 and the other end bonded to the lead 4B. In the example shown in FIGS. 4 and 5, three wires 5D are bonded to each of the two pad portions 221. Each wire 5D electrically connects the source electrode 22 (each pad portion 221) and the lead 4B.

As shown in FIG. 4, the wire 5E has one end bonded to the element electrode 35 of the control element 3 and the other end bonded to the gate electrode 13 (pad portion 131) of the semiconductor element 1. The wire 5E electrically connects the element electrode 35 and the gate electrode 13 (pad portion 131). As shown in FIG. 4, the wire 5E overlaps with only the lead 4A and the lead 4D of the lead frame 4, as viewed in plan. That is, the wire 5E does not overlap with the leads 4B, 4C and 4E-4H, as viewed in plan.

As shown in FIG. 4, the wire 5F has one end bonded to the element electrode 36 of the control element 3 and the other end bonded to the gate electrode 23 (pad portion 231) of the semiconductor element 2. The wire 5F electrically connects the element electrode 36 and the gate electrode 23 (pad portion 231). As shown in FIG. 4, the wire 5F overlaps with only the lead 4B and the lead 4D of the lead frame 4, as viewed in plan. That is, the wire 5F does not overlap with the leads 4A, 4C and 4E-4H, as viewed in plan.

As shown in FIG. 4, the wire 5G has one end bonded to the element electrode 38 of the control element 3 and the other end bonded to the lead 4A. The wire 5G electrically connects the element electrode 38 and the lead 4A.

As shown in FIG. 4, the wire 5H has one end bonded to the element electrode 32 of the control element 3 and the other end bonded to the lead 4D. The wire 5H electrically connects the element electrode 32 and the lead 4D.

As shown in FIG. 4, the wire 5I has one end bonded to the element electrode 37 of the control element 3 and the other end bonded to the lead 4E. The wire 5I electrically connects the element electrode 37 and the lead 4E.

As shown in FIG. 4, the wire 5J has one end bonded to the element electrode 31 of the control element 3 and the other end bonded to the lead 4F. The wire 5J electrically connects the element electrode 31 and the lead 4F.

As shown in FIG. 4, the wire 5K has one end bonded to the element electrode 33 of the control element 3 and the other end bonded to the lead 4G. The wire 5K electrically connects the element electrode 33 and the lead 4G.

As shown in FIG. 4, the wire 5L has one end bonded to the element electrode 34 of the control element 3 and the other end bonded to the lead 4H. The wire 5L electrically connects the element electrode 34 and the lead 4H.

In the present embodiment, the wire 5A may correspond to the "first connection member" recited in the claims. The wire 5B may correspond to the "second connection member" recited in the claims. The wire 5C may correspond to the "third connection member" recited in the claims. The wire 5D may correspond to the "fourth connection member" recited in the claims. The wire 5E may correspond to the "fifth connection member" recited in the claims. The wire 5F may correspond to the "sixth connection member" recited in the claims.

The sealing member 6 is a protective member for the semiconductor elements 1 and 2 and the control element 3. As shown in FIG. 2, the sealing member 6 covers the semiconductor elements 1 and 2, the control element 3, a part of the lead frame 4 and the wires 5A-5L. The sealing member 6 is made of an insulating resin material such as epoxy resin. The sealing member 6 may be rectangular as viewed in plan. The shape of the sealing member 6 is not limited to the example shown in FIGS. 1-4. As shown in FIGS. 1, 3 and 4, the sealing member 6 has a resin obverse surface 61, a resin reverse surface 62 and a plurality of resin side surfaces 631-634.

The resin obverse surface 61 and the resin reverse surface 62 are spaced apart from each other in the z direction. The resin obverse surface 61 faces in the z2 direction as shown in FIG. 1, and the resin reverse surface 62 faces in the z1 direction as shown in FIG. 3. A part of each lead 4A-4J (the surface facing in the z1 direction) is exposed from the resin reverse surface 62. The resin side surfaces 631-634 each are between the resin obverse surface 61 and the resin reverse surface 62 in the z direction and connected to both of the surfaces. As shown in FIG. 4, the resin side surfaces 631 and 632 are spaced apart from each other in the x direction, with the resin side surface 631 facing in the x1 direction and the resin side surface 632 facing in the x2 direction. As shown in FIG. 4, the resin side surfaces 633 and 634 are spaced apart from each other in the y direction, with the resin side surface 633 facing in the y1 direction and the resin side surface 634 facing in the y2 direction.

Next, a power converter W1 provided with the semiconductor device A1 is described below with reference to FIGS. 9-11. In the description given below, the reference potential may be referred to as the ground voltage $V_{GND}$.

Figure 9:
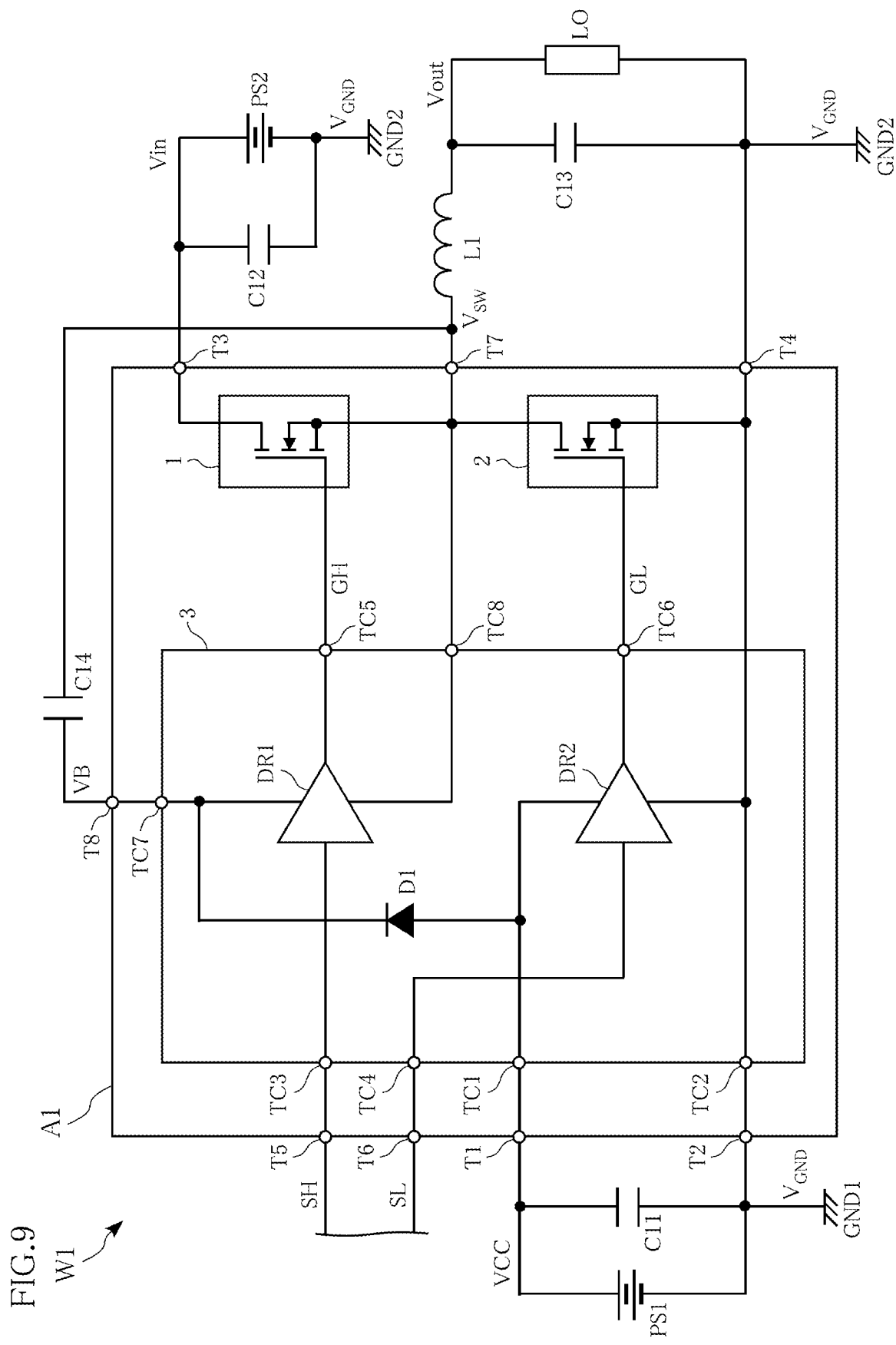
FIG. 9 is a circuit diagram of a power converter according to the first embodiment.

FIG. 9 is a circuit diagram of the power converter W1. The power converter W1 shown in FIG. 9 is a synchronous rectification type step-down DC/DC converter. The power converter W1 may have any of a circuit configuration for constant current control, a circuit configuration for constant voltage control, and a circuit configuration for constant power control. The power converter W1 is a power circuit that steps down the input voltage Vin to generate a desired output voltage Vout. The output voltage Vout is supplied to a load LO. Note that the circuit diagram shown in FIG. 9 is an example.

As shown in FIG. 9, the power converter W1 includes the semiconductor device A1, two external power supplies PS1 and PS2, and a plurality of discrete components (a plurality of capacitors C11-C14 and an inductor L1) in its circuit configuration. As shown in FIG. 9, the semiconductor device A1 includes a plurality of external terminals T1-T8, two semiconductor elements 1 and 2, and a control element 3 in its circuit configuration. Note that one or more of the discrete components may be incorporated in the semiconductor device A1.

The external power supply PS1 generates a power supply voltage VCC for driving the control element 3. The terminal on the high-potential side of the external power supply PS1 is connected to the external terminal T1. The terminal on the low-potential side of the external power supply PS1 is connected to the first ground GND1, or a reference potential. A capacitor C11 is connected in parallel to the external power supply PS1. The capacitor C11 is a bypass capacitor to stabilize the power supply voltage VCC.

The external power supply PS2 generates an input voltage Vin. The terminal on the high-potential side of the external power supply PS2 is connected to the external terminal T3. The terminal on the low-potential side of the external power supply PS2 is connected to the second ground GND2, or a reference potential. Although an example in which the first ground GND1 and the second ground GND2 have the same reference potential is shown, the reference potential of the first ground GND1 and that of the second ground GND2 may differ from each other. A capacitor C12 is connected in parallel to the external power supply PS2. The capacitor C12 is a bypass capacitor to stabilize the input voltage Vin.

The inductor L1 has two terminals, one of which is connected to the external terminal T7 and the other to the load LO and the capacitor C13. The capacitor C13 has a first end connected to the inductor L1 and a second end connected to the second ground GND2. The inductor L1 and the capacitor C13 form an LC filter circuit. The capacitor C14 has a first end connected to the external terminal T7 and a second end connected to the external terminal T18. The capacitor C14, together with diode D1, forms a bootstrap circuit. The capacitor C14 generates a boot voltage VB.

The external terminal T1 is the input end for the power supply voltage VCC. The external terminal T1 is connected to the terminal on the high-potential side of the external power supply PS1. The external terminal T1 is connected to the control element (connection terminal TC1 described later) inside the semiconductor device A1. The external terminal T1 may correspond to the lead 4F in the module structure of the semiconductor device A1.

The external terminal T2 is connected to the first ground GND1, or a reference potential. The external terminal T2 is connected to the control element 3 (connection terminal TC2 described later) inside the semiconductor device A1. The external terminal T2 may correspond to the lead 4D in the module structure of the semiconductor device A1.

The external terminal T3 is the input end for the input voltage Vin. The external terminal T3 is connected to the terminal on the high-potential side of the external power supply PS2. The external terminal T3 is connected to the drain of the semiconductor element 1 inside the semiconductor device A1. The external terminal T3 may correspond to the lead 4C in the module structure of the semiconductor device A1.

The external terminal T4 is connected to the second ground GND2, or a reference potential. The external terminal T4 is connected to the source of the semiconductor element 2 inside the semiconductor device A1. The external terminal T4 may correspond to the lead 4B in the module structure of the semiconductor device A1.

The external terminal T5 is the input end for a control signal SH. The control signal SH is the signal for controlling the switching operation of the semiconductor element 1. The control signal SH is, for example, a rectangular pulse wave that alternately switches between a high level and a low level. The external terminal T5 is connected to the control element 3 (connection terminal TC3 described later) inside the semiconductor device A1. The external terminal T5 may correspond to the lead 4G in the module structure of the semiconductor device A1.

The external terminal T6 is the input end for a control signal SL. The control signal SL is the signal for controlling the switching operation of the semiconductor element 2. The control signal SL is, for example, a rectangular pulse wave that alternately switches between a high level and a low level. The control signal SL and the control signal SH have a high-level period and a low-level period that are inverted to each other. The external terminal T6 is connected to the control element 3 (connection terminal TC4 described later) inside the semiconductor device A1. The external terminal T6 may correspond to the lead 4H in the module structure of the semiconductor device A1.

The external terminal T7 is the output end for the output voltage $V_{SW}$. The output voltage $V_{SW}$ is a voltage signal generated by the switching operations of the semiconductor element 1 and the semiconductor element 2. The external terminal T7 is connected to the connection point between the source of the semiconductor element 1 and the drain of the semiconductor element 2 inside the semiconductor device A1. The external terminal T7 may correspond to the lead 4A in the module structure of the semiconductor device A1.

The external terminal T8 is the input end for the boot voltage VB. The boot voltage VB is the voltage signal generated by the capacitor C14 and the diode D1 described later. The second end of the capacitor C14 is connected to the external terminal T8. The external terminal T8 is connected to the control element (connection terminal TC7 described later) inside the semiconductor device A1. The external terminal T8 may correspond to the lead 4E in the module structure of the semiconductor device A1.

As shown in FIG. 9, the two semiconductor elements 1 and 2 are MOSFETs. Each of the semiconductor elements 1 and 2 is switched on (conducting state) or off (blocking state) in response to the drive signal GH or GL input to the gate. The two semiconductor elements 1 and 2 form a half-bridge switching circuit. The semiconductor element 1 and the semiconductor element 2 are the upper arm and the lower arm, respectively, of the switching circuit.

The drain of the semiconductor element 1 is connected to the external terminal T3, and the source of the semiconductor element 1 is connected to the drain of the semiconductor element 2. The gate of the semiconductor element 1 is connected to the control element 3 (connection terminal TC5 described later).

When the gate receives the drive signal GH (first drive signal) from the control element 3, the semiconductor element 1 performs a switching operation in response to the drive signal GH. The semiconductor element 1 becomes the conducting state when the drive signal GH input to the gate is at a high level and becomes the blocking state when the drive signal GH input to the gate is at a low level. The semiconductor element 1 in the present example is of the normally-off type, but may be of the normally-on type.

The drain of the semiconductor element 2 is connected to the source of the semiconductor element 1, and the source of the semiconductor element 2 is connected to the external terminal T4. The gate of the semiconductor element 2 is connected to the control element 3 (connection terminal TC6 described later).

When the gate receives the drive signal GL (second drive signal) from the control element 3, the semiconductor element 2 performs a switching operation in response to the drive signal GL. The semiconductor element 2 becomes the conducting state when the drive signal GL input to the gate is at a high level and becomes the blocking state when the drive signal GL input to the gate is at a low level. The semiconductor element 2 in the present example is of the normally-off type, but may be of the normally-on type.

The connection point between the source of the semiconductor element 1 and the drain of the semiconductor element 2 is connected to the external terminal T7 and also to the control element 3 (connection terminal TC8 described later). The output voltage $V_{SW}$ is applied to the external terminal T7 by the switching operation of the semiconductor element 1 and the switching operation of the semiconductor element 2.

The control element 3 mainly controls the switching operations of the two semiconductor elements 1 and 2. The control element 3 generates the drive signals GH and GL based on the received control signals SH and SL and inputs the generated drive signals GH and GL to the semiconductor elements 1 and 2, respectively. The control element 3 includes a plurality of connection terminals TC1-TC8, two drive circuits DR1 and DR2, and a diode D1 in its internal circuit. The control element 3 is a single-chip IC incorporating the two drive circuits DR1, DR2 and the diode D1.

The connection terminal TC1, which is connected to the external terminal T1, is the input end for the power supply voltage VCC for the control element 3. The connection terminal TC1 corresponds to the element electrode 31 in the module structure of the semiconductor device A1. Thus, the power supply voltage VCC is input to the element electrode 31.

The connection terminal TC2 is connected to the external terminal T2 and to the first ground GND1. The connection terminal TC2 corresponds to the element electrode 32 in the module structure of the semiconductor device A1. Thus, the element electrode 32 is connected to the first ground GND1.

The connection terminal TC3, which is connected to the external terminal T5, is the input end for the control signal SH for the control element 3. The connection terminal TC3 corresponds to the element electrode 33 in the module structure of the semiconductor device A1. Thus, the control signal SH is input to the element electrode 33.

The connection terminal TC4, which is connected to the external terminal T6, is the input end for the control signal SL for the control element 3. The connection terminal TC4 corresponds to the element electrode 34 in the module structure of the semiconductor device A1. Thus, the control signal SL is input to the element electrode 34.

The connection terminal TC5 is the output end for the drive signal GH. The connection terminal TC5 is connected to the gate of the semiconductor element 1. The connection terminal TC5 corresponds to the element electrode 35 in the module structure of the semiconductor device A1. Thus, the drive signal GH is output from the element electrode 35.

The connection terminal TC6 is the output end for the drive signal GL. The connection terminal TC6 is connected to the gate of the semiconductor element 2. The connection terminal TC6 corresponds to the element electrode 36 in the module structure of the semiconductor device A1. Thus, the drive signal GL is output from the element electrode 36.

The connection terminal TC7, which is connected to the external terminal T8, is the input end for the boot voltage VB for the control element 3. The connection terminal TC7 corresponds to the element electrode 37 in the module structure of the semiconductor device A1. Thus, the boot voltage VB is input to the element electrode 37.

The connection terminal TC8, which is connected to the connection point between the semiconductor element 1 (source) and the semiconductor element 2 (drain), is the input end for the output voltage $V_{SW}$. The connection terminal TC8 corresponds to the element electrode 38 in the module structure of the semiconductor device A1. Thus, the output voltage $V_{SW}$ is input from the element electrode 38.

The drive circuit DR1 generates the drive signal GH based on the received control signal SH. The drive signal GH is a signal for switching the semiconductor element 1 and obtained by raising the control signal SH to a level required for enabling the switching operation of the semiconductor device 1. The drive circuit DR1 outputs the generated drive signal GH from the connection terminal TC5. Since the connection terminal TC5 is connected to the gate of the semiconductor element 1, the drive signal GH is input to the gate of the semiconductor element 1. The drive signal GH is a signal whose high level corresponds to the boot voltage VB and whose low level corresponds to the source voltage of the semiconductor element 1. The source voltage of the semiconductor element 1 is input to the drive circuit DR1 through the connection terminal TC8. The gate voltage of the semiconductor element 1 is determined based on the source voltage of the semiconductor element 1. The drive circuit DR1 may be disposed outside the control element 3.

The drive circuit DR2 generates the drive signal GL based on the received control signal SL. The drive signal GL is a signal for switching the semiconductor element 2 and obtained by raising the control signal SL to a level required for enabling the switching operation of the semiconductor element 2. The drive circuit DR2 outputs the generated drive signal GL from the connection terminal TC6. Since the connection terminal TC6 is connected to the gate of the semiconductor element 2, the drive signal GL is input to the gate of the semiconductor element 2. The drive signal GL is a signal whose high level corresponds to the power supply voltage VCC and whose low level corresponds to the ground voltage $V_{GND}$. The gate voltage of the semiconductor element 2 is determined based on the ground voltage $V_{GND}$. The drive circuit DR2 may be disposed outside the control element 3.

The diode D1 has an anode connected to the connection terminal TC1 and a cathode connected to the connection terminal TC7. The diode D1, together with capacitor C14, forms a bootstrap circuit. The bootstrap circuit generates the boot voltage VB and supplies the boot voltage to the drive circuit DR1. The diode D1 may be disposed outside the control element 3.

An example of the operation of the semiconductor device A1 is described below.

In the semiconductor device A1, when control signals SH and SL are input from the external terminals T5 and T6 to the control element 3, the control element 3 generates drive signals GH and GL. The drive signals GH and GL are input from the control element 3 to the gates of the semiconductor elements 1 and 2, respectively. In accordance with the drive signals GH and GL, the semiconductor device A1 alternates a first period in which the semiconductor element 1 is in the conducting state and the semiconductor element 2 is in the blocking state and a second period in which the semiconductor element 1 is in the blocking state and the semiconductor element 2 is in the conducting state. In the first period, the input voltage Vin is applied to the external terminal T7. In the second period, the external terminal T7 is connected to the reference potential. (The ground voltage $V_{GND}$ is applied to the external terminal T7.) Thus, the output voltage $V_{SW}$ from the external terminal T7 is a pulse wave whose high level is equal to the input voltage Vin and whose low level is equal to the ground voltage $V_{GND}$. The output voltage $V_{SW}$ is smoothed by the inductor L1 and capacitor C13 for conversion into a DC output voltage Vout. By operating in the above manner, the semiconductor device A1 transforms (steps down) the input voltage Vin to the output voltage Vout.

The first period and the second period are repeated alternately at a predetermined cycle, and the step-down ratio can be changed in accordance with the ratio of the first period to the second period in one cycle. For example, when the first period is 25% of one cycle (the second period is 75% of one cycle), the output voltage Vout is transformed to ¼ times the input voltage Vin (Vout=Vin×(25/100)). A dead time in which both of the semiconductor devices 1 and 2 are in the blocking state may be provided between the first period and the second period.

Figure 10:
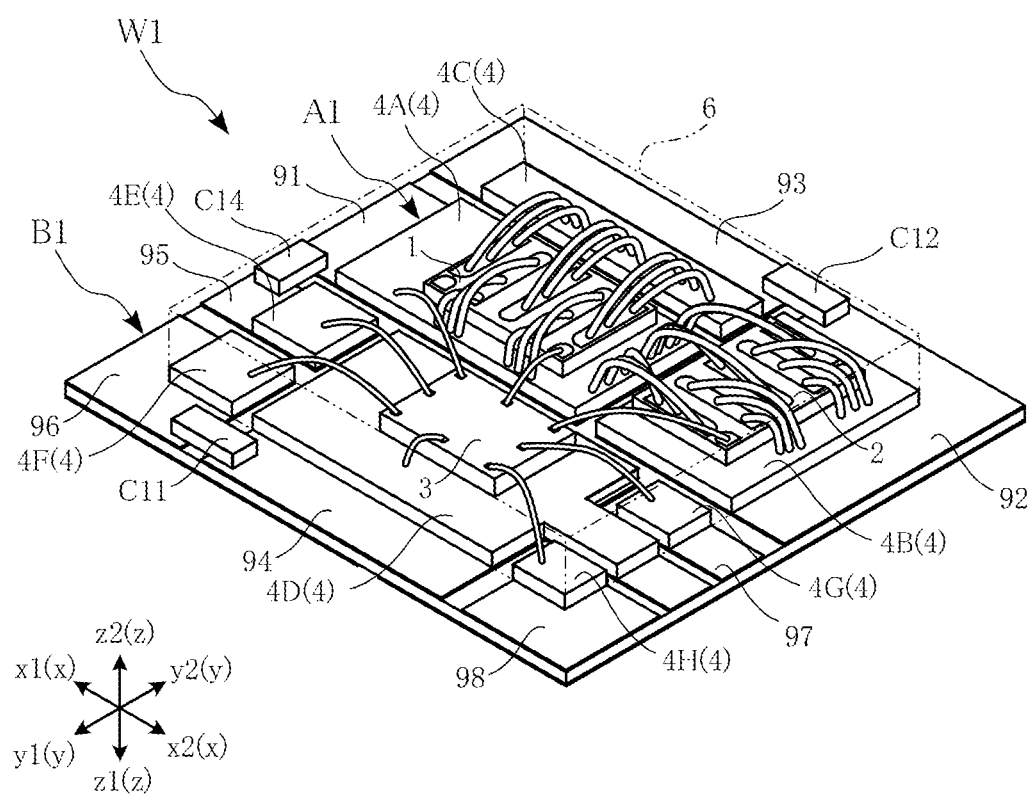
FIG. 10 is a perspective view of the power converter according to the first embodiment.
Figure 11:
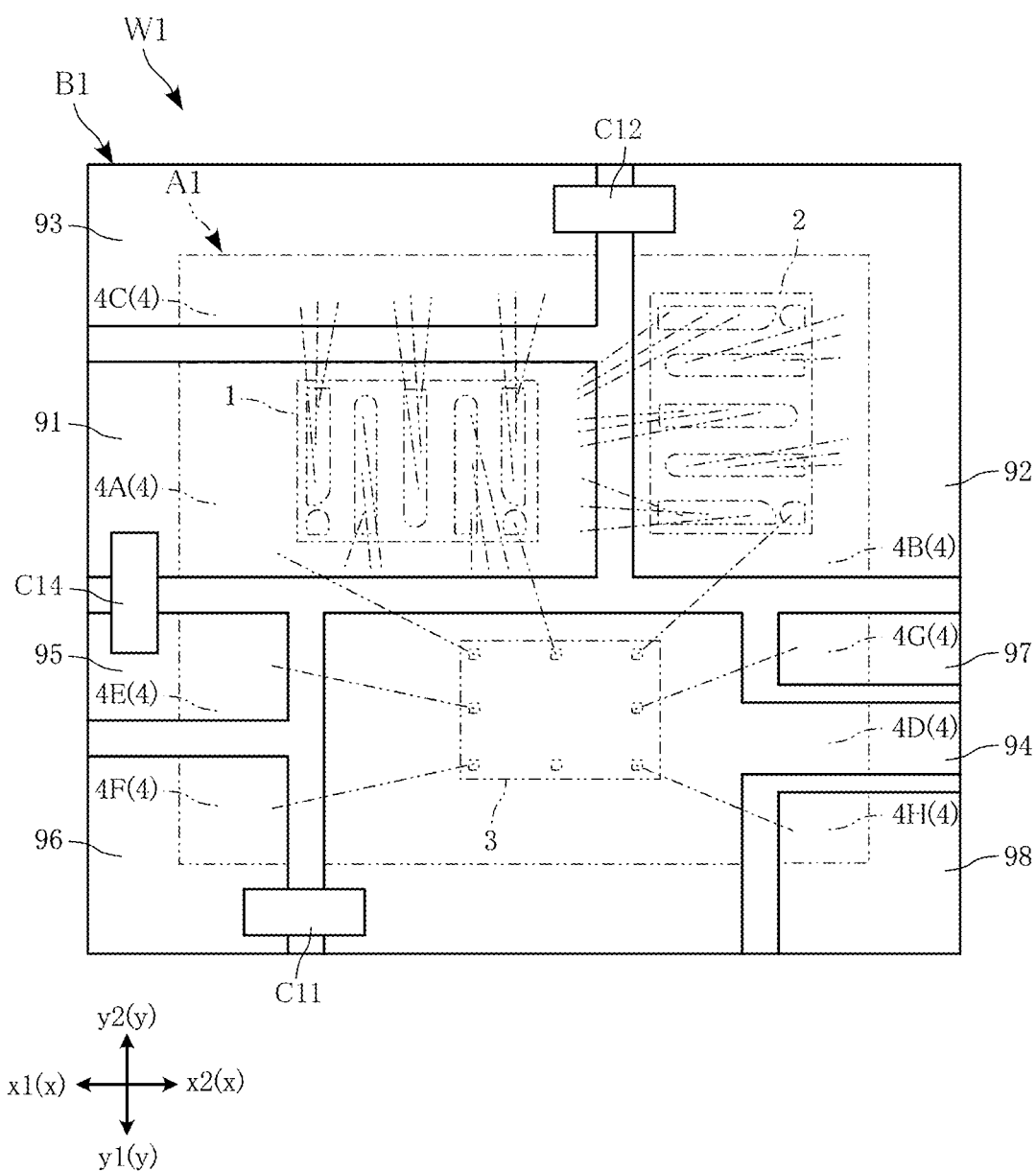
FIG. 11 is a plan view of the power converter according to the first embodiment.

FIGS. 10 and 11 show a structure example of the power converter W1, in which the electronic components including the semiconductor device A1 are mounted on a circuit board B1. FIG. 10 is a perspective view of the power converter W1. FIG. 11 is a plan view of the power converter W1. In FIGS. 10 and 11, the semiconductor device A1 is shown by imaginary lines (two-dot chain lines). Note that FIGS. 10 and 11 show a part of the power converter W1 and do not show all of the electronic components and wiring patterns. For example, the inductor L1 and the capacitor C13 are omitted.

The circuit board B1 is a printed circuit board such as a glass epoxy board. The circuit board B1 may be any of a single-sided substrate having one layer, a double-sided substrate having two layers, and a multilayer board having three or more layers. Various electronic components of the power converter W1 are mounted on the circuit board B1. In the example shown in FIGS. 10 and 11, in addition to the semiconductor device A1, a plurality of capacitors C11, C12 and C14 are mounted on the circuit board B1. The circuit board B1 is formed with a plurality of wiring patterns 91-98. The wiring patterns 91-98 may be made of a metal containing copper, for example. The wiring patterns 91-98 are a part of the wiring in the circuit diagram shown in FIG. 9. The wiring patterns 91-98 are spaced apart from each other.

To the wiring pattern 91, the lead 4A is bonded, so that the wiring pattern 91 is electrically connected to the lead 4A. The output voltage $V_{SW}$ (the voltage generated by the switching operations of the semiconductor elements 1 and 2) is applied to the wiring pattern 91 via the lead 4A.

To the wiring pattern 92, the lead 4B is bonded, so that the wiring pattern 92 is electrically connected to the lead 4B. The wiring pattern 92 is connected to the second ground GND2 (reference potential). Accordingly, the lead 4B, the wires 5D and the source electrode 22 are also connected to the second ground GND2 (reference potential).

To the wiring pattern 93, the lead 4C is bonded, so that the wiring pattern 93 is electrically connected to the lead 4C. To the wiring pattern 93, the terminal on the high-potential side of the external power supply PS2 is connected, and the input voltage Vin is applied. The input voltage Vin applied to the wiring pattern 93 is transferred to the lead 4C and input to the drain electrode 11 via the wires 5A.

To the wiring pattern 94, the lead 4D is bonded, so that the wiring pattern 94 is electrically connected to the lead 4D. The wiring pattern 94 is connected to the first ground GND1 (reference potential). Accordingly, the lead 4D, the wire 5H and the element electrode 32 are also connected to the first ground GND1 (reference potential).

To the wiring pattern 95, the lead 4E is bonded, so that the wiring pattern 95 is electrically connected to the lead 4E. The boot voltage VB is applied to the wiring pattern 95. The boot voltage VB applied to the wiring pattern 95 is transferred to the lead 4E and input to the element electrode 37 of the control element 3 via the wire 5I.

To the wiring pattern 96, the lead 4F is bonded, so that the wiring pattern 96 is electrically connected to the lead 4F. To the wiring pattern 96, the terminal on the high-potential side of the external power supply PS1 is connected, and the power supply voltage VCC is applied. The power supply voltage VCC applied to the wiring pattern 96 is transferred to the lead 4F and input to the element electrode 31 of the control element 3 via the wire 5J.

To the wiring pattern 97, the lead 4G is bonded, so that the wiring pattern 97 is electrically connected to the lead 4G. The control signal SH is input to the wiring pattern 97. The control signal SH input to the wiring pattern 97 is transferred to the lead 4G and input to the element electrode 33 of the control element 3 via the wire 5K.

To the wiring pattern 98, the lead 4H is bonded, so that the wiring pattern 98 is electrically connected to the lead 4H. The control signal SL is input to the wiring pattern 98. The control signal SL input to the wiring pattern 98 is transferred to the lead 4H and input to the element electrode 34 of the control element 3 via the wire 5L.

The bonding between the wiring patterns 91-98 and the leads 4A-4H may be performed, for example, by using solder (not shown).

The capacitor C11 bridges between the wiring pattern 94 and the wiring pattern 96, as viewed in plan. The capacitor C11 has two terminals, one of which is bonded to the wiring pattern 94 and the other to the wiring pattern 96. Such bonding may be performed, for example, by using solder (not shown). The lead 4D and the lead 4F are electrically connected to each other via the capacitor C11. Thus, as shown in the circuit diagram of FIG. 9, the capacitor C11 is connected between the external terminal T1 and the external terminal T2 (first ground GND1).

The capacitor C12 bridges between the wiring pattern 92 and the wiring pattern 93, as viewed in plan. The capacitor C12 has two terminals, one of which is bonded to the wiring pattern 92 and the other to the wiring pattern 93. Such bonding may be performed, for example, by using solder (not shown). The lead 4B and the lead 4C are electrically connected to each other via the capacitor C12. Thus, as shown in the circuit diagram of FIG. 9, the capacitor C12 is connected between the external terminal T3 and the external terminal T4 (second ground GND2).

The capacitor C14 bridges between the wiring pattern 91 and the wiring pattern 95, as viewed in plan. The capacitor C14 has two terminals, one of which is bonded to the wiring pattern 91 and the other to the wiring pattern 95. Such bonding may be performed, for example, by using solder (not shown). The lead 4A and the lead 4E are electrically connected to each other via the capacitor C14. Thus, as shown in the circuit diagram of FIG. 9, the capacitor C14 is connected between the external terminal T7 and the external terminal T8.

The semiconductor device A1 having the above configuration has the following advantages.

The semiconductor device A1 has leads 4A, 4B and 4C. The lead 4C is electrically connected to the drain electrode 11 of the semiconductor element 1, the lead 4A to the source electrode 12 of the semiconductor element 1 and the drain electrode 21 of the semiconductor element 2, and the lead 4B to the source electrode 22 of the semiconductor element 2. The lead 4A and the lead 4B are adjacent to each other in the x direction as viewed in the z direction, and the lead 4C is adjacent to each of the lead 4A and the lead 4B as viewed in the z direction. Such a configuration allows the leads 4A, 4B and 4C to be arranged close to each other. This makes it possible to shorten the wiring for the current path (power system current path) from the lead 4C through the drain electrode 11—source electrode 12 of the semiconductor element 1, the lead 4A, and the drain electrode 21-source electrode 22 of the semiconductor element 2 to the lead 4B. The semiconductor device A1 can thus reduce parasitic inductance and parasitic resistance, and hence achieve higher efficiency and energy savings.

In the semiconductor device A1, the pad portions 111 (drain electrode 11) and the pad portions 121 (source electrode 12) of the semiconductor element 1 extend in the first extension direction. Further, the pad portions 211 (drain electrode 21) and the pad portions 221 (source electrode 22) of the semiconductor element 2 extend in the second extension direction. The second extension direction is inclined with respect to the first extension direction, and the inclination angle is not less than 10° and not more than 170°, for example. It is now assumed that the first extension direction and the second extension direction are the same and the semiconductor element 1 and the semiconductor element 2 are aligned along these extension directions. In such a case, to make the wires 5A-5D short, the lead 4C and the lead 4B need to be arranged on opposite sides of the lead 4A in the above-mentioned extension direction. In contrast, in the semiconductor device A1, the lead 4B can be arranged close to the lead 4C, because the second extension direction is inclined with respect to the first extension direction. Thus, the wiring of the above-mentioned power system current path can be shortened.

The semiconductor device A1 has the lead 4A on which the semiconductor element 1 is mounted, the lead 4B on which the semiconductor element 2 is mounted, and the lead 4D on which the control element 3 is mounted. The lead 4A and the lead 4B overlap with each other as viewed in the x direction, and the lead 4D overlaps with both of the lead 4A and the lead 4B as viewed in the y direction. With such a configuration, the distance between the semiconductor element 1 and the semiconductor element 2 can be made shorter than that in the semiconductor device disclosed in Patent Document 1. Specifically, in the semiconductor device disclosed in Patent Document 1, two semiconductor elements (switching elements) are disposed on opposite sides of the control element (control IC) as viewed in plan. Thus, the connection between the two semiconductor elements needs be routed avoiding the control element, which tends to result in a long wiring distance. In contrast, in the semiconductor device A1, the control element 3 is not disposed between the semiconductor element 1 and the semiconductor element 2, which allows shortening the distance of the wiring connecting the semiconductor element 1 and the semiconductor element 2 (the respective lengths of the wires 5B, wires 5C and part of lead 4A in the present embodiment). The semiconductor device A1 can thus reduce parasitic inductance and parasitic resistance, and hence achieve higher efficiency and energy savings.

In the semiconductor device A1, both of the lead 4A and the lead 4B are disposed on the y2 side of the lead 4D and overlap with the lead 4D as viewed in the y direction. In this way, the semiconductor elements 1 and 2 can be arranged on one side in the y direction, while the control element 3 can be arranged on the other side in the y direction. When the semiconductor device A1 is energized, the semiconductor elements 1, 2 and the control element 3 generate heat. The amount of the heat generated by the semiconductor elements 1 and 2 is greater than that generated by the control element 3. The heat from the semiconductor elements 1 and 2, if transferred to the control element 3, can cause malfunction or performance degradation of the control element 3. In the semiconductor device A1, however, the semiconductor elements 1, 2 and the control element 3 are separated from each other by disposing the leads 4A and 4B on one side (y2 side) of the lead 4. Thus, the semiconductor device A1 reduces the heat transfer from the semiconductor elements 1, 2 to the control element 3 to prevent malfunction or performance degradation of the control element 3.

The semiconductor device A1 has the wire 5E, which overlaps with only the lead 4A and the lead 4D of the lead frame 4, as viewed in plan. Since no other leads are disposed between the semiconductor element 1 and the control element 3, the separation distance between the semiconductor element 1 and the control element 3 can be made small. Accordingly, the length of the wire 5E can be shortened, which reduces the parasitic inductance and parasitic resistance of the wire 5E. In particular, since the wire 5E is a transmission line for the drive signal (drive signal GH) that controls the switching operation of the semiconductor element 1, degradation of the responsiveness or malfunction of the switching operation of the semiconductor element 1 is prevented.

The semiconductor device A1 has the wire 5F, which overlaps with only the lead 4A and the lead 4D of the lead frame 4, as viewed in plan. Since no other leads are disposed between the semiconductor element 2 and the control element 3, the separation distance between the semiconductor element 2 and the control element 3 can be made small. Accordingly, the length of the wire 5F can be shortened, which reduces the parasitic inductance and parasitic resistance of the wire 5F. In particular, since the wire 5F is a transmission line for the drive signal (drive signal GL) that controls the switching operation of the semiconductor element 2, degradation of the responsiveness or malfunction of the switching operation of the semiconductor element 2 is prevented.

In the first embodiment, the case where the first ground end GND1 and the second ground end GND2 have the same reference potential is shown. However, the reference potential of the first ground end GND1 and that of the second ground end GND2 may differ from each other. In the semiconductor device A1, the switching operations of the semiconductor element 1 and the semiconductor element 2 can cause fluctuations in the potential of the second ground GND2. When the first ground GND1 and the second ground GND2 are at the same potential, the potential of the first ground GND1 can also fluctuate in response to the fluctuations in the potential of the second ground GND2. Such fluctuations of the first ground GND1 may cause a malfunction of the control element 3. Thus, the potential of the first ground GND1 and the potential of the second ground GND2 may be made different from each other so that the potential of the first ground GND1 will not fluctuate even if the potential of the second ground GND2 fluctuates. In such a variation, malfunction of the control element 3 is prevented. In the semiconductor device A1, for example, the lead 4D connected to the first ground GND1 and the lead 4B connected to the second ground GND2 are spaced apart from each other, which allows the potential of the first ground GND1 (lead 4D) and the potential of the second ground GND2 (lead 4B) to be made different from each other.

Figure 12:
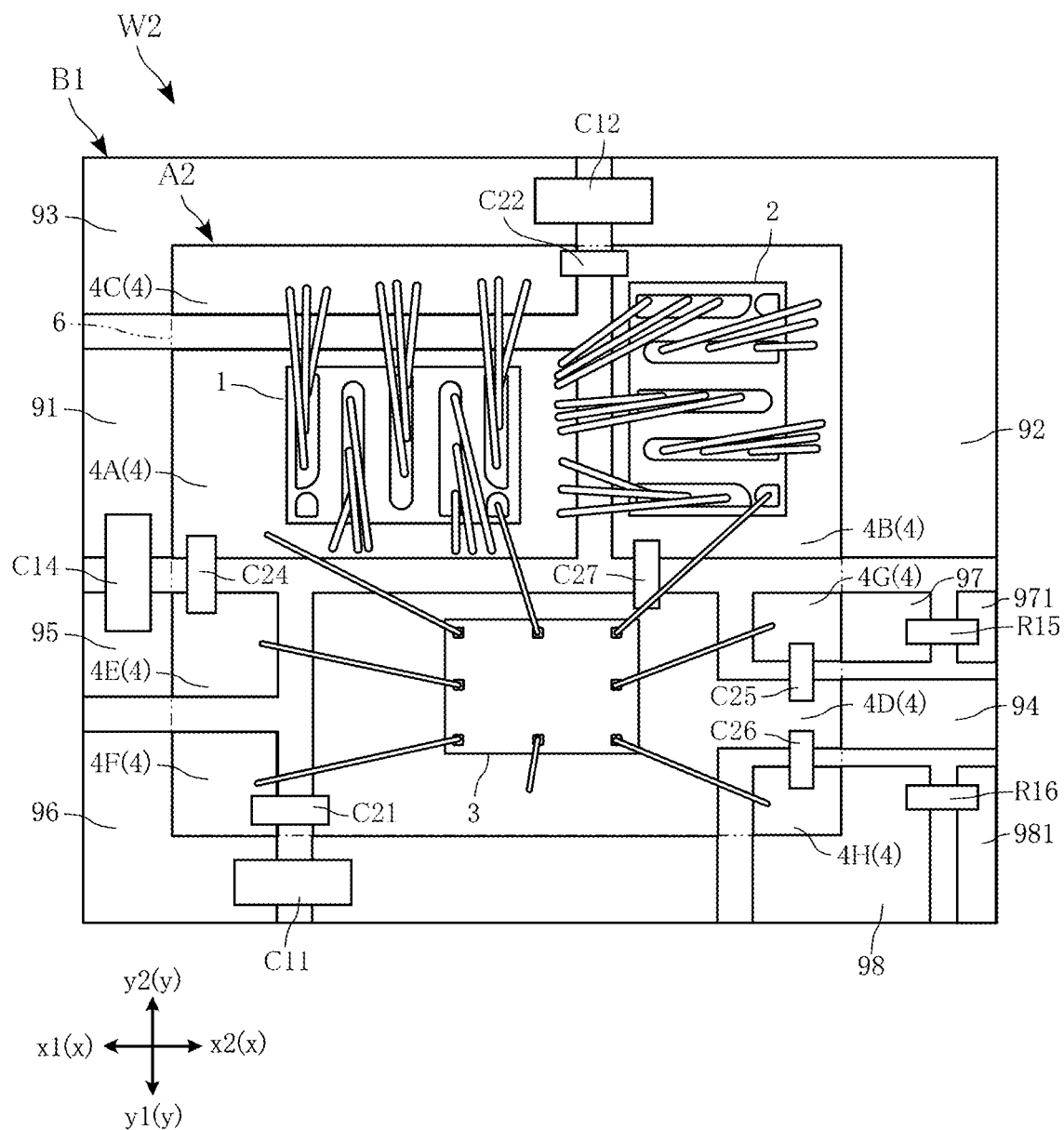
FIG. 12 is a plan view of a power converter according to a second embodiment.
Figure 13:
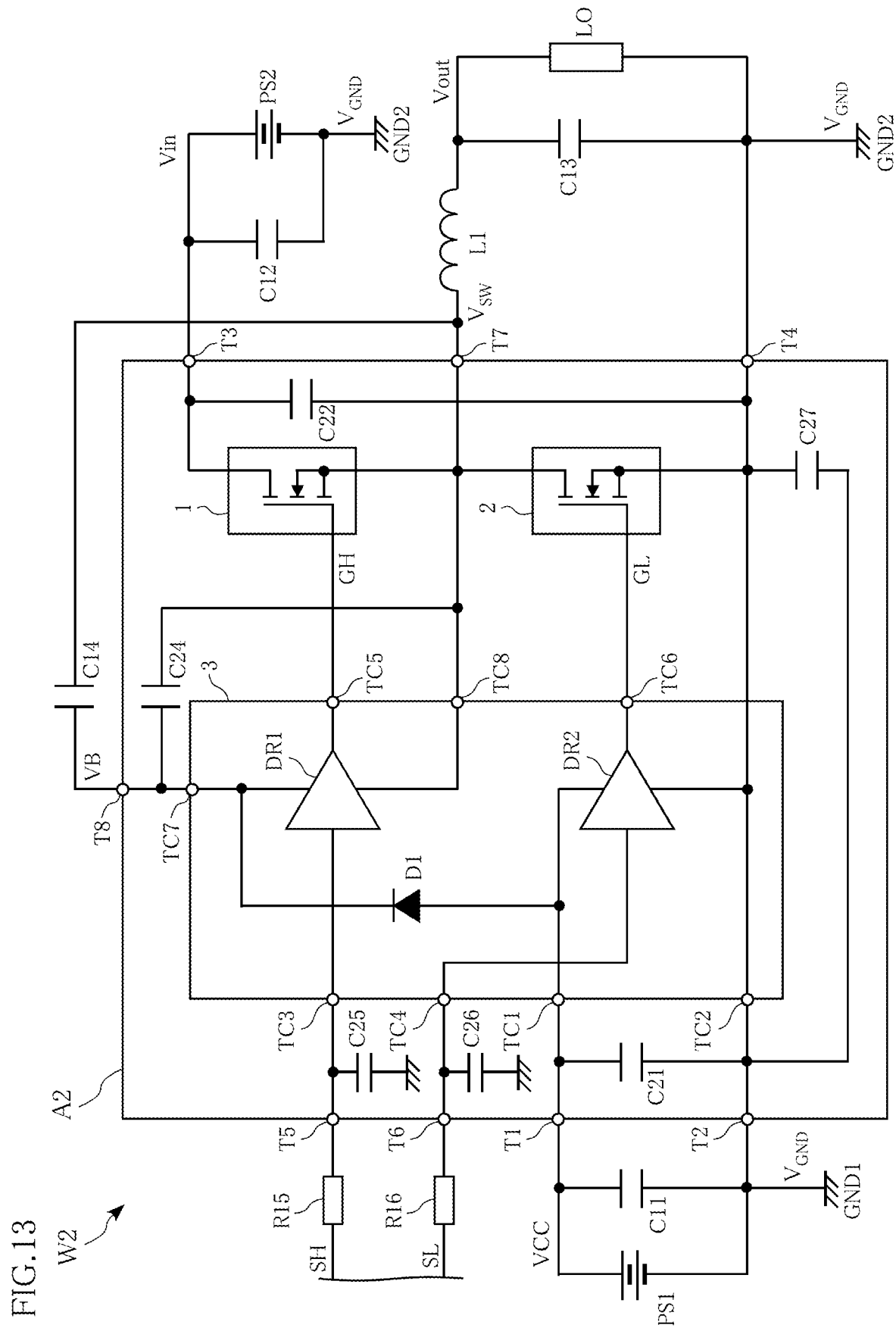
FIG. 13 is a circuit diagram of the power converter according to the second embodiment.

A semiconductor device A2 according to a second embodiment is described below with reference to FIGS. 12 and 13. FIG. 12 is a plan view of a power converter W2 provided with the semiconductor device A2, in which the sealing member 6 is shown by imaginary lines (two-dot chain lines). FIG. 13 is a circuit diagram of the power converter W2.

As shown in FIGS. 12 and 13, as compared with the semiconductor device A1, the semiconductor device A2 additionally includes a plurality of capacitors C21, C22, C24, C25, C26 and C27. As compared with the power converter W1, the power converter W2 additionally includes resistors R15 and R16.

The capacitor C21 has two terminals, one of which is bonded to the lead 4D and the other to the lead 4F, as shown in FIG. 12. Thus, the lead 4D and the lead 4F are electrically connected to each other via the wiring patterns 94, 96 and the capacitor C11 as with the first embodiment, and electrically connected to each other via the capacitor C21 as well. As shown in FIG. 13, the capacitor C21 is connected in parallel to the capacitor C11. Bonding of the capacitor C21 may be performed, for example, by using solder (not shown). The capacitor C21 is covered with the sealing member 6 and incorporated in the semiconductor device A2. Although a single capacitor C21 is provided in the example shown in FIG. 12, a plurality of capacitors C21 may be provided. In such a case, each of the plurality of capacitors C21 is bonded to the lead 4D and the lead 4F. The capacitance of the capacitor C21 (or the composite capacitance when a plurality of capacitors C21 are provided) is less than or equal to the capacitance of the capacitor C11 (or the composite capacitance when a plurality of capacitors C11 are provided), and the plan view area of the capacitor C21 is smaller than or equal to the plan view area of capacitor C11. Note that the configuration (capacitance, plan view area, etc.) of the capacitor C21 is not limited to this. The capacitor C21 may correspond to the "third capacitor" recited in the claims.

The capacitor C22 has two terminals, one of which is bonded to the lead 4B and the other to the lead 4C, as shown in FIG. 12. Thus, the lead 4B and the lead 4C are electrically connected to each other via the wiring patterns 92, 93 and the capacitor C12 as with the first embodiment, and electrically connected to each other via the capacitor C22 as well. As shown in FIG. 13, the capacitor C22 is connected in parallel to the capacitor C12. Bonding of the capacitor C22 may be performed, for example, by using solder (not shown). The capacitor C22 is covered with the sealing member 6 and incorporated in the semiconductor device A2. Although a single capacitor C22 is provided in the example shown in FIG. 12, a plurality of capacitors C22 may be provided. In such a case, each of the plurality of capacitors C22 is bonded to the lead 4B and the lead 4C. The capacitance of the capacitor C22 (or the composite capacitance when a plurality of capacitors C22 are provided) is less than or equal to the capacitance of the capacitor C12 (or the composite capacitance when a plurality of capacitors C12 are provided), and the plan view area of the capacitor C22 is smaller than or equal to the plan view area of capacitor C12. Note that the configuration (capacitance, plan view area, etc.) of the capacitor C22 is not limited to this. The capacitor C22 may correspond to the "first capacitor" recited in the claims.

The capacitor C24 has two terminals, one of which is bonded to the lead 4A and the other to the lead 4E, as shown in FIG. 12. Thus, the lead 4A and the lead 4E are electrically connected to each other via the wiring patterns 91, 95 and the capacitor C14 as with the first embodiment, and electrically connected to each other via the capacitor C24 as well. As shown in FIG. 13, the capacitor C24 is connected in parallel to the capacitor C14. Bonding of the capacitor C24 may be performed, for example, by using solder (not shown). The capacitor C24 is covered with the sealing member 6 and incorporated in the semiconductor device A2. Although a single capacitor C24 is provided in the example shown in FIG. 12, a plurality of capacitors C24 may be provided. In such a case, each of the plurality of capacitors C24 is bonded to the lead 4A and the lead 4E. The capacitance of the capacitor C24 (or the composite capacitance when a plurality of capacitors C24 are provided) is less than or equal to the capacitance of the capacitor C14 (or the composite capacitance when a plurality of capacitors C14 are provided), and the plan view area of the capacitor C24 is smaller than or equal to the plan view area of capacitor C14. Note that the configuration (capacitance, plan view area, etc.) of the capacitor C24 is not limited to this. The capacitor C24 may correspond to the "second capacitor" recited in the claims.

The capacitor C25 has two terminals, one of which is bonded to the lead 4D and the other to the lead 4G, as shown in FIG. 12. Thus, the lead 4D and the lead 4G are electrically connected to each other via the capacitor C25. Bonding of the capacitor C25 may be performed, for example, by using solder (not shown). The capacitor C25 is covered with the sealing member 6 and incorporated in the semiconductor device A2. Although a single capacitor C25 is provided in the example shown in FIG. 12, a plurality of capacitors C25 may be provided. In such a case, each of the plurality of capacitors C25 is bonded to the lead 4D and the lead 4G. The capacitor C25 may correspond to the "fourth capacitor" recited in the claims.

The capacitor C26 has two terminals, one of which is bonded to the lead 4D and the other to the lead 4H, as shown in FIG. 12. Thus, the lead 4D and the lead 4H are electrically connected to each other via the capacitor C26. Bonding of the capacitor C26 may be performed, for example, by using solder (not shown). The capacitor C26 is covered with the sealing member 6 and incorporated in the semiconductor device A2. Although a single capacitor C26 is provided in the example shown in FIG. 12, a plurality of capacitors C26 may be provided. In such a case, each of the plurality of capacitors C26 is bonded to the lead 4D and the lead 4H. The capacitor C26 may correspond to the "fifth capacitor" recited in the claims.

The capacitor C27 has two terminals, one of which is bonded to the lead 4B and the other to the lead 4D, as shown in FIG. 12. Thus, the lead 4B and the lead 4D are electrically connected to each other via the capacitor C27. Bonding of the capacitor C27 may be performed, for example, by using solder (not shown). The capacitor C27 is covered with the sealing member 6 and incorporated in the semiconductor device A2. Although a single capacitor C27 is provided in the example shown in FIG. 12, a plurality of capacitors C27 may be provided. In such a case, each of the plurality of capacitors C27 is bonded to the lead 4B and the lead 4D. The capacitor C27 may correspond to the "sixth capacitor" recited in the claims.

The resistor R15 has two terminals. As shown in FIG. 12, one of the terminals is bonded to the wiring pattern 97, and the other terminal is bonded to the wiring pattern 971 that is spaced apart from each of the wiring patterns 91-98. Thus, the wiring pattern 97 and the wiring pattern 971 are electrically connected to each other via the resistor R15. Bonding of the resistor R15 may be performed, for example, by using solder (not shown). As shown in FIG. 13, the resistor 15 and the capacitor C25 constitute an RC filter. The RC filter reduces the noise contained in the control signal SH input from the outside. Note that an LC filter may be formed by using an inductor instead of the resistor R15.

The resistor R16 has two terminals. As shown in FIG. 12, one of the terminals is bonded to the wiring pattern 98, and the other terminal is bonded to the wiring pattern 981 that is spaced apart from each of the wiring patterns 91-98. Thus, the wiring pattern 98 and the wiring pattern 981 are electrically connected to each other via the resistor R16. Bonding of the resistor R16 may be performed, for example, by using solder (not shown). As shown in FIG. 13, the resistor 16 and the capacitor C26 constitute an RC filter. The RC filter reduces the noise contained in the control signal SL input from the outside. Note that an LC filter may be formed by using an inductor instead of the resistor R16.

The semiconductor device A2 having the above configuration has the following advantages.

In the semiconductor device A2, as with the semiconductor device A1, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A2 can shorten the wiring of the above-mentioned power system current path. The semiconductor device A2 can thus reduce parasitic inductance and parasitic resistance, and hence achieve higher efficiency and energy savings.

The semiconductor device A2 has the capacitor C21. In the semiconductor device A1, the lead 4D and the lead 4F are electrically connected to each other via the circuit board B1 (the wiring patterns 92, 96 and the capacitor C11). In the semiconductor device A2, however, the lead 4D and the lead 4F are electrically connected to each other via the capacitor C21 as well. With such a configuration, the current path between the gate and the source (between the gate electrode 23 and the source electrode 22) of the semiconductor element 2 is smaller than that in the power converter W1. Thus, the semiconductor device A2 can reduce the surge voltage applied to the semiconductor element 2, and hence reduce the problems caused by the surge voltage.

The semiconductor device A2 has the capacitor C22. In the semiconductor device A1, the lead 4B and the lead 4C are electrically connected to each other via the circuit board B1 (the wiring patterns 92, 93 and the capacitor C12). In the semiconductor device A2, however, the lead 4B and the lead 4C are electrically connected to each other via the capacitor C22 as well. With such a configuration, the above-mentioned power system current path is smaller than that in the power converter W1. Thus, the semiconductor device A2 can reduce the parasitic inductance and parasitic resistance in the power system current path as compared with the semiconductor device A1, and hence can reduce the generation of a surge voltage.

The semiconductor device A2 has the capacitor C24. In the semiconductor device A1, the lead 4A and the lead 4E are electrically connected to each other via the circuit board B1 (the wiring patterns 91, 95 and the capacitor C14). In the semiconductor device A2, however, the lead 4A and the lead 4E are electrically connected to each other via the capacitor C24 as well. With such a configuration, the current path between the gate and the source (between the gate electrode 13 and the source electrode 12) of the semiconductor element 1 is smaller than that in the power converter W1. Thus, the semiconductor device A2 can reduce the surge voltage applied to the semiconductor device 1, and hence reduce the problems caused by the surge voltage.

The semiconductor device A2 has the capacitor C25, and the circuit board B1 has the resistor R15. With such a configuration, the capacitor C25 and the resistor R15 form an RC filter in the power converter W2. As mentioned above, the RC filter reduces the noise contained in the drive signal GH input to the semiconductor element 1. Thus, the semiconductor device A2 can stabilize the switching operation of the semiconductor element 1 as compared with the semiconductor device A1.

The semiconductor device A2 has the capacitor C26, and the circuit board B1 has the resistor R16. With such a configuration, the capacitor C26 and the resistor R16 form an RC filter in the power converter W2. As mentioned above, the RC filter reduces the noise contained in the drive signal GL input to the semiconductor element 2. Thus, the semiconductor device A2 can stabilize the switching operation of the semiconductor element 2 as compared with the semiconductor device A1.

The semiconductor device A2 has the capacitor C27. If the capacitor C27 is not provided, the electrical connection between the lead 4B and the lead 4D needs to be established by the wiring on the circuit board B1. In such a case, the wiring needs to be routed in such a way as to avoid other wiring patterns, which tends to result in long wiring. In the semiconductor device A2, however, the capacitor C27 electrically connects the lead 4B and the lead 4D, allowing shortening the current path between the lead 4B and the lead 4D. By shortening the current path between the lead 4B and the lead 4D, the semiconductor device A2 can prevent the semiconductor elements 1 and 2 from erroneously turning on.

The semiconductor device A2 also have the same advantages as the semiconductor device A1 due to the parts configured in the same manner as the semiconductor device A1.

Although the semiconductor device A2 have the capacitors C21, C22, C24, C25, C26 and C27 in the second embodiment, the semiconductor device A2 may not have all of these capacitors. That is, it is only required that the semiconductor device A2 has at least one of the capacitors C21, C22, C24, C25, C26 and C27.

Although the power converter W2 has the capacitor C11 in the second embodiment, the capacitor C11 may not be mounted on the circuit board B1 when the capacitance of the capacitor C21 (or the composite capacitance when a plurality of capacitors C21 are provided) of the semiconductor device A2 is sufficiently large. Similarly, when the capacitance of the capacitor C22 (or the composite capacitance when a plurality of capacitors C22 are provided) of the semiconductor device A2 is sufficiently large, the capacitor C12 may not be mounted on the circuit board B1. Also, when the capacitance of the capacitor C24 (or the composite capacitance when a plurality of capacitors C24 are provided)

of the semiconductor device A2 is sufficiently large, the capacitor C14 may not be mounted on the circuit board B1.

Figure 14:
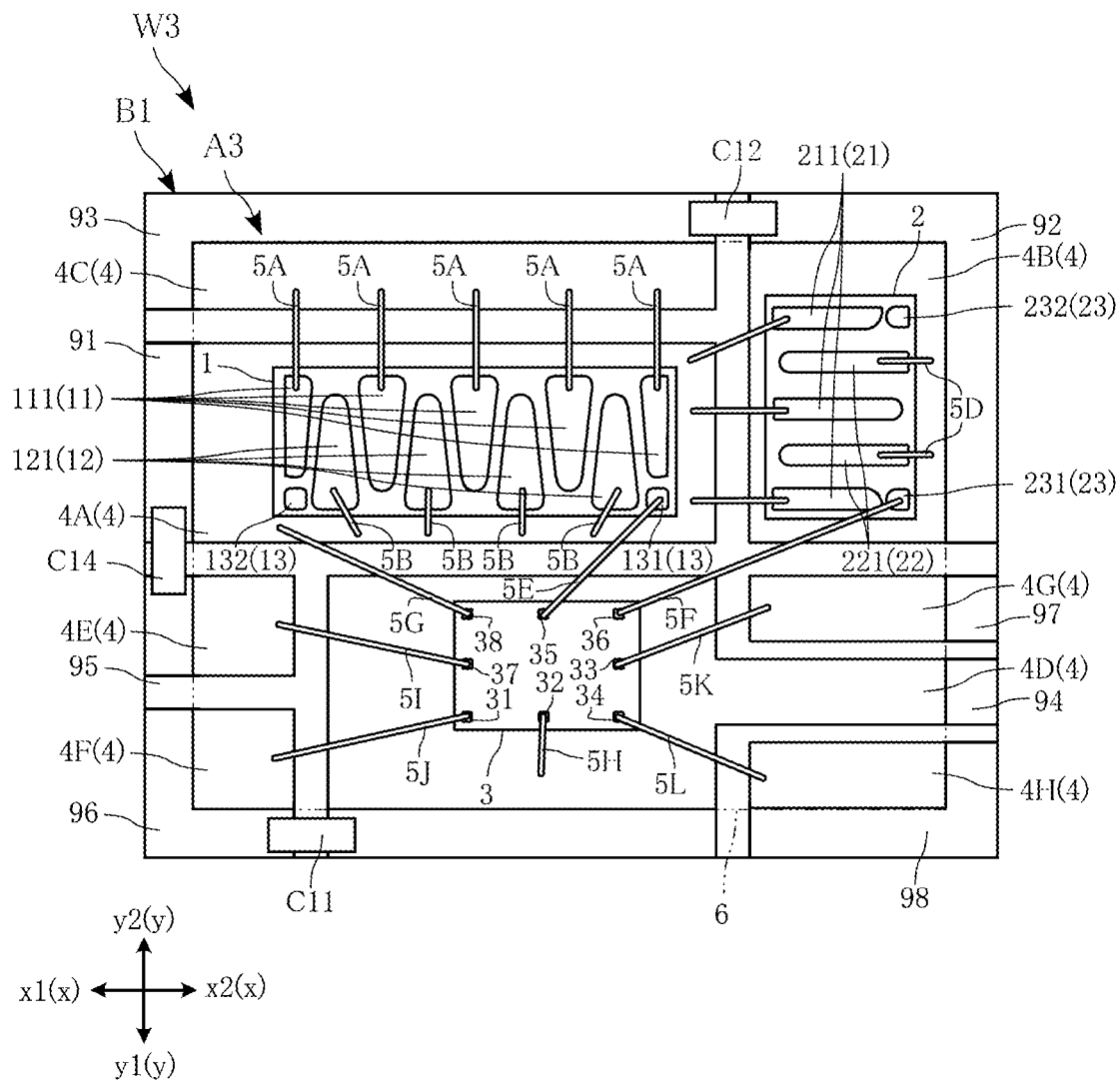
FIG. 14 is a plan view of a power converter according to a third embodiment.

A semiconductor device A3 according to a third embodiment is described below with reference to FIG. 14. FIG. 14 is a plan view of a power converter W3 provided with the semiconductor device A3, in which the sealing member 6 is shown by imaginary lines (two-dot chain lines). In the semiconductor device A3 shown in FIG. 14, the number and wire diameters of the wires 5A, 5B, 5C and 5D differ from those of the semiconductor device A1, but these may be the same as the semiconductor device A1.

The semiconductor element 1 of the semiconductor device A3 has a higher performance (e.g., a lower on-resistance) than the semiconductor element 2 of the semiconductor device A3, and also has a higher performance (e.g., a lower on-resistance) than the semiconductor element 1 of the semiconductor device A1. Also, as shown in FIG. 14, the plan view area of the semiconductor element 1 of the semiconductor device A3 is larger than the plan view area of the semiconductor element 2 of the semiconductor device A3 and also larger than the plan view area of the semiconductor element 1 of the semiconductor device A1. Note that the semiconductor element 2 of the semiconductor device A3 is the same semiconductor element as the semiconductor element 2 of the semiconductor device A1.

As shown in FIG. 14, the semiconductor element 1 of the semiconductor device A3 differs from the semiconductor element 1 of the semiconductor device A1 in configuration of each electrode (the drain electrode 11 and the source electrode 12) of the semiconductor element 1. Specifically, the shapes in plan view of the pad portions 111, 121 are different.

As shown in FIG. 14, each pad portion 111 of the semiconductor device A3 is tapered. Specifically, the dimension of each pad portion 111 in the x direction reduces from the edge on the y2 side toward the edge on the y1 side in the y direction. Each pad portion 111 is generally triangular as viewed in plan. As with the pad portions 111, each of the pad portions 121 is also tapered. Specifically, the dimension of each pad portion 121 in the x direction reduces from the edge on the y1 side toward the edge on the y2 side in the y direction. Each pad portion 121 is generally triangular as viewed in plan. In the semiconductor device A3 again, each of the pad portions 111 and 121 extends in the first extension direction (y direction in FIG. 14), and the pad portions 111 and the pad portions 121 are alternately arranged in the first arrangement direction (x direction in FIG. 14).

The semiconductor device A3 having the above configuration has the following advantages.

In the semiconductor device A3, as with the semiconductor device A1, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A3 can shorten the wiring of the above-mentioned power system current path. The semiconductor device A3 can thus reduce parasitic inductance and parasitic resistance, and hence achieve higher efficiency and energy savings.

In the semiconductor device A3, the on-resistance of the semiconductor element 1 is lower than the on-resistance of the semiconductor element 2, and also lower than the on-resistance of the semiconductor element 1 of the semiconductor device A1. With such a configuration, the conduction loss in the semiconductor element 1 is smaller than the conduction loss in the semiconductor element 2, and also smaller than the conduction loss in the semiconductor element 1 of the semiconductor device A1. Thus, the semiconductor device A3 can reduce the conduction loss in the semiconductor element 1, as compared with the semiconductor device A1. In particular, the semiconductor device A3 can effectively reduce the conduction loss when used in a voltage booster circuit.

The plan view area of the semiconductor element 1 of the semiconductor device A3 is larger than the plan view area of the semiconductor element 1 of the semiconductor device A1. With such a configuration, the semiconductor device A3 is larger in area of the element obverse surface $1a$ of the semiconductor element 1 than the semiconductor device A1, and hence can improve the heat dissipation from the element obverse surface $1a$. That is, the semiconductor device A3 can reduce the thermal resistance of the semiconductor element 1, as compared with the semiconductor device A1.

The semiconductor device A3 also have the same advantages as the semiconductor device A1 due to the parts configured in the same manner as the semiconductor device A1. Note that the semiconductor device A3 can have the same advantages as the semiconductor device A2 by additionally including the capacitors C21, C22, C24, C25, C26 and C27 as with the semiconductor device A2.

Figure 15:
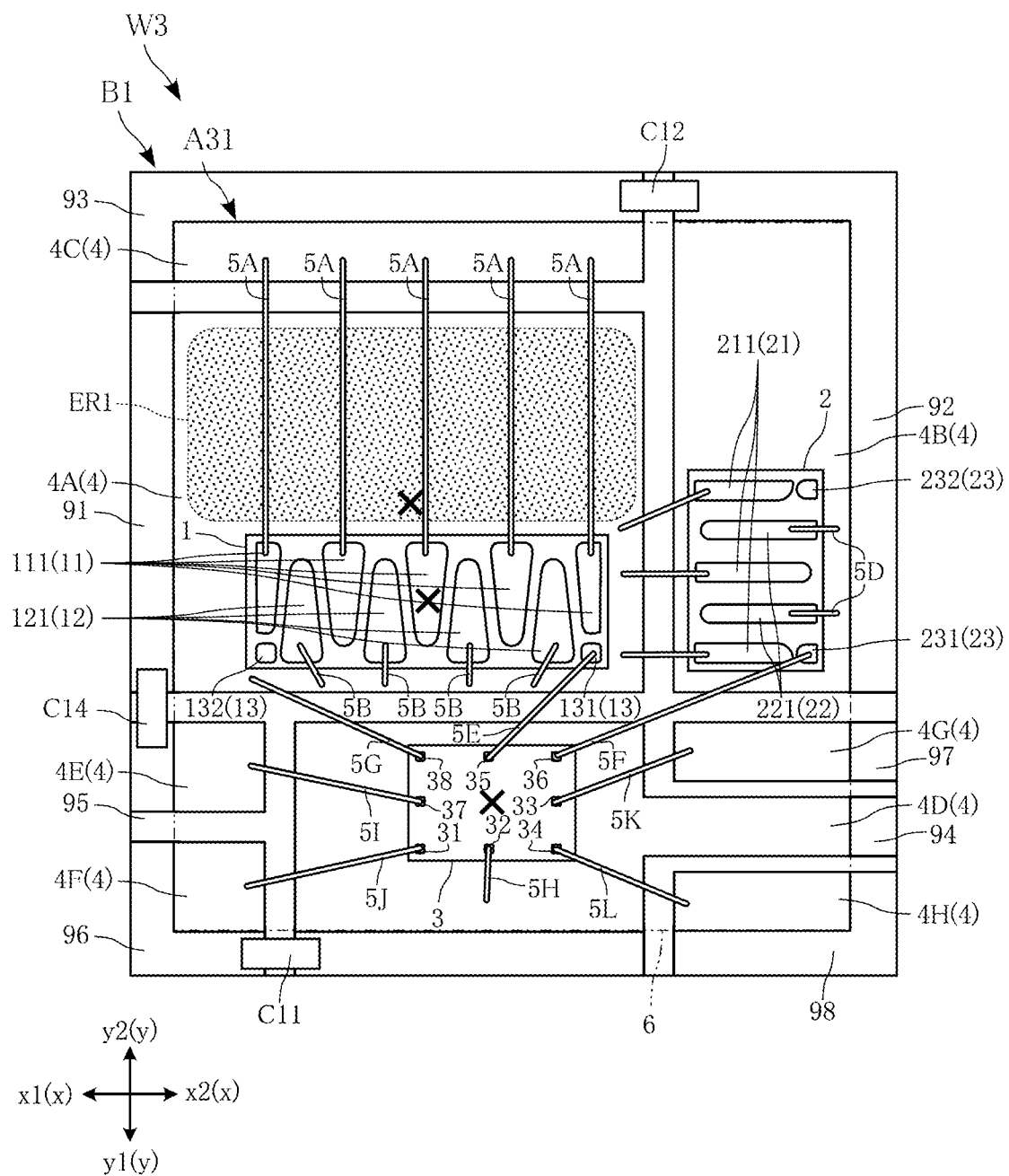
FIG. 15 is a plan view of a power converter according to a variation of the third embodiment.

FIG. 15 shows a variation of the semiconductor device A3 according to the third embodiment. The semiconductor device A31 according to the present variation is larger in plan view area of the lead 4A than the semiconductor device A3. Specifically, the lead 4A of the semiconductor device A31 (see FIG. 15) has an expanded region ER1 (indicated by dots in FIG. 15 for convenience of understanding) in addition to the area of the lead 4A of the semiconductor device A3 (see FIG. 14). Note that with the addition of the expanded region ER1, the plan view area of the lead 4B is also expanded.

In the semiconductor device A31, the plan view area of the lead 4A is larger than that of the lead 4A of the semiconductor device A3. Thus, the efficiency of heat transfer from the lead 4A to the wiring pattern 91 of the circuit board B1 is improved. That is, in the semiconductor device A31, the heat from the semiconductor element 1 can be dissipated from both of the element obverse surface $1a$ and the element reverse surface $1b$. In particular, making the plan view area of the lead 4A 1.1 to 5 times the plan view area of the semiconductor element 1 improves the efficiency of heat transfer from the lead 4A to the wiring pattern 91 while preventing an increase in size of the semiconductor device A31.

Moreover, as viewed in plan, the distance between the center of the semiconductor element 1 and the center of the control element 3 is smaller than the distance between the center of the lead 4A and the center of the control element 3, as shown in FIG. 15. For convenience of understanding, in FIG. 15, each of the center of the semiconductor element 1, the center of the lead 4A and the center of the control element 3 as viewed in plan is marked with an X (cross sign). In this way, the semiconductor element 1 is arranged close to the control element 3, as viewed in plan. With such a configuration, the length of the wire 5E can be shortened, so that the parasitic inductance and parasitic resistance of the wire 5E can be reduced.

Figure 16:
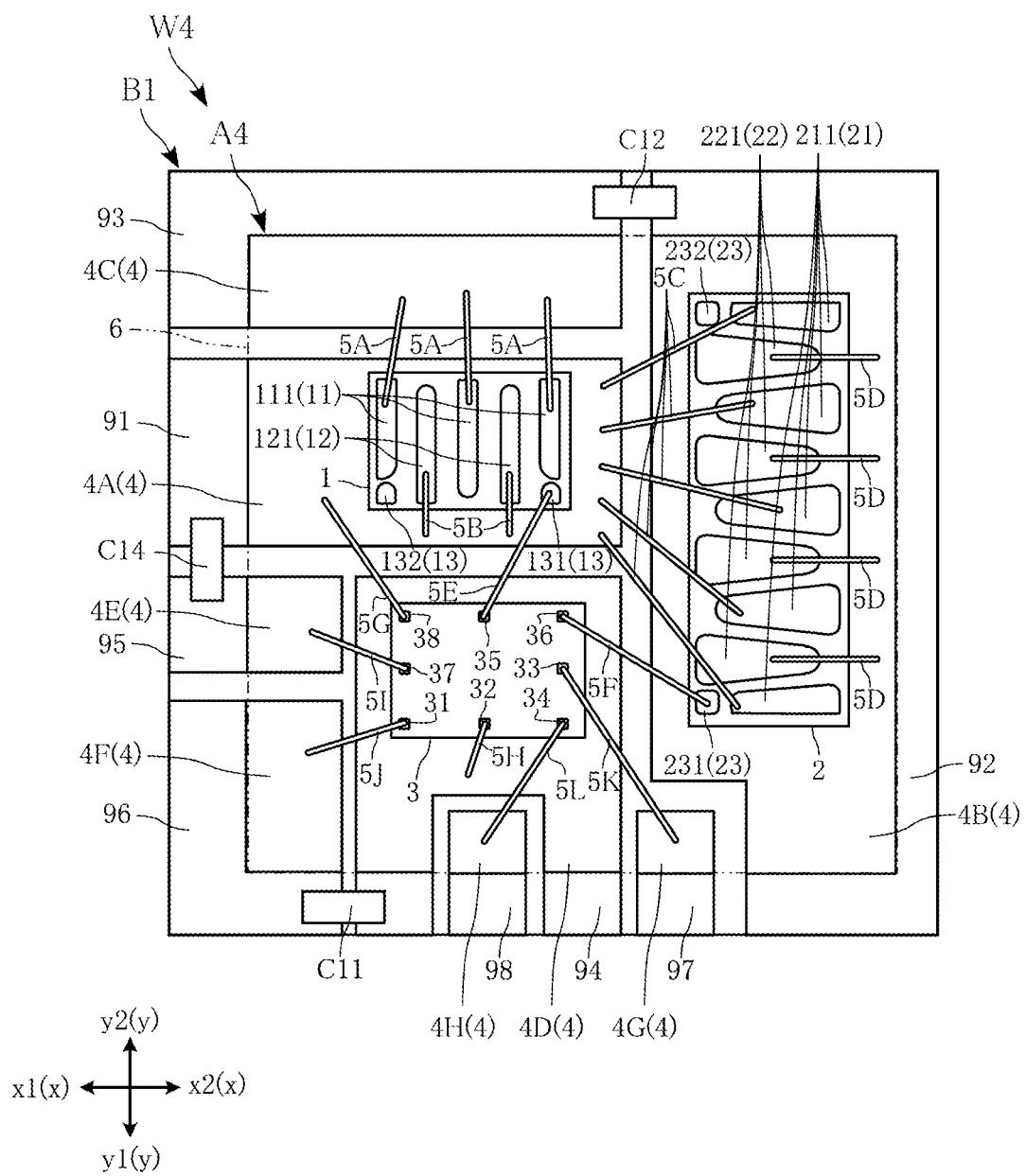
FIG. 16 is a plan view of a power converter according to a fourth embodiment.

A semiconductor device A4 according to a fourth embodiment is described below with reference to FIG. 16. FIG. 16 is a plan view of a power converter W4 provided with the semiconductor device A4, in which the sealing member 6 is shown by imaginary lines (double-dotted lines). In the semiconductor device A4 shown in FIG. 16, the number and wire diameters of the wires 5A, 5B, 5C and 5D differ from those of the semiconductor device A1, but these may be the same as the semiconductor device A1.

The semiconductor element 2 of the semiconductor device A4 has a higher performance (e.g., a lower on-resistance) than the semiconductor element 1 of the semiconductor device A4, and also has a higher performance (e.g., a lower on-resistance) than the semiconductor element 2 of the semiconductor device A1. Also, as shown in FIG. 16, the plan view area of the semiconductor element 2 of the semiconductor device A4 is larger than the plan view area of the semiconductor element 1 of the semiconductor device A4 and also larger than the plan view area of the semiconductor element 2 of the semiconductor device A1. Note that the semiconductor element 1 of the semiconductor device A4 is the same semiconductor element as the semiconductor element 1 of the semiconductor device A1.

As shown in FIG. 16, the semiconductor element 2 of the semiconductor device A4 differs from the semiconductor element 2 of the semiconductor device A1 in configuration of each electrode (the drain electrode 21 and the source electrode 22) of the semiconductor element 2. Specifically, the shapes in plan view of the pad portions 211, 221 are different.

As shown in FIG. 16, each pad portion 211 of the semiconductor device A4 is tapered. Specifically, the dimension of each pad portion 211 in the y direction reduces from the edge on the x2 side toward the edge on the x1 side in the x direction. Each pad portion 211 is generally triangular as viewed in plan. As with the pad portions 211, each of the pad portions 221 is also tapered. Specifically, the dimension of each pad portion 221 in the y direction reduces from the edge on the x1 side toward the edge on the x2 side in the x direction. Each pad portion 221 is generally triangular as viewed in plan. In the semiconductor device A4 again, each of the pad portions 211 and 221 extends in the second extension direction (the x direction in FIG. 16), and the pad portions 211 and the pad portions 221 are alternately arranged in the second arrangement direction (the y direction in FIG. 16).

In the semiconductor device A4, the configuration (arrangement, size in plan view, shape, etc.) of each lead 4A-4H of the lead frame 4 is changed as appropriate. For example, since the plan view area of the semiconductor element 2 is made large, the size of the lead 4B for mounting the semiconductor element 2 is also made large. As shown in FIG. 16, the lead 4B of the semiconductor device A4 extends from the edge on the y2 side to the edge on the y1 side of the lead frame 4 and overlaps with all of the other leads 4A, 4C-4H as viewed in the x direction.

The semiconductor device A4 having the above configuration has the following advantages.

In the semiconductor device A4, as with the semiconductor device A1, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A4 can shorten the wiring of the above-mentioned power system current path. The semiconductor device A4 can thus reduce parasitic inductance and parasitic resistance, and hence achieve higher efficiency and energy savings.

In the semiconductor device A4, the on-resistance of the semiconductor element 2 is lower than the on-resistance of the semiconductor element 1, and also lower than the on-resistance of the semiconductor element 2 of the semiconductor device A1. With such a configuration, the conduction loss in the semiconductor element 2 is smaller than the conduction loss in the semiconductor element 1, and also smaller than the conduction loss in the semiconductor element 2 of the semiconductor device A1. Thus, the semiconductor device A4 can reduce the conduction loss in the semiconductor element 2, as compared with the semiconductor device A1. In particular, the semiconductor device A4 can effectively reduce the conduction loss when used in a step-down circuit.

The plan view area of the semiconductor element 2 of the semiconductor device A4 is larger than the plan view area of the semiconductor element 2 of the semiconductor device A1. With such a configuration, the semiconductor device A4 is larger in area of the element obverse surface 2a of the semiconductor element 2 than the semiconductor device A1, and hence can improve the heat dissipation from the element obverse surface 2a. That is, the semiconductor device A4 can reduce the thermal resistance of the semiconductor element 2, as compared with the semiconductor device A1.

The semiconductor device A4 also have the same advantages as the semiconductor device A1 due to the parts configured in the same manner as the semiconductor device A1. Note that the semiconductor device A4 can have the same advantages as the semiconductor device A2 by additionally including the capacitors C21, C22, C24, C25, C26 and C27 as with the semiconductor device A2.

Figure 17:
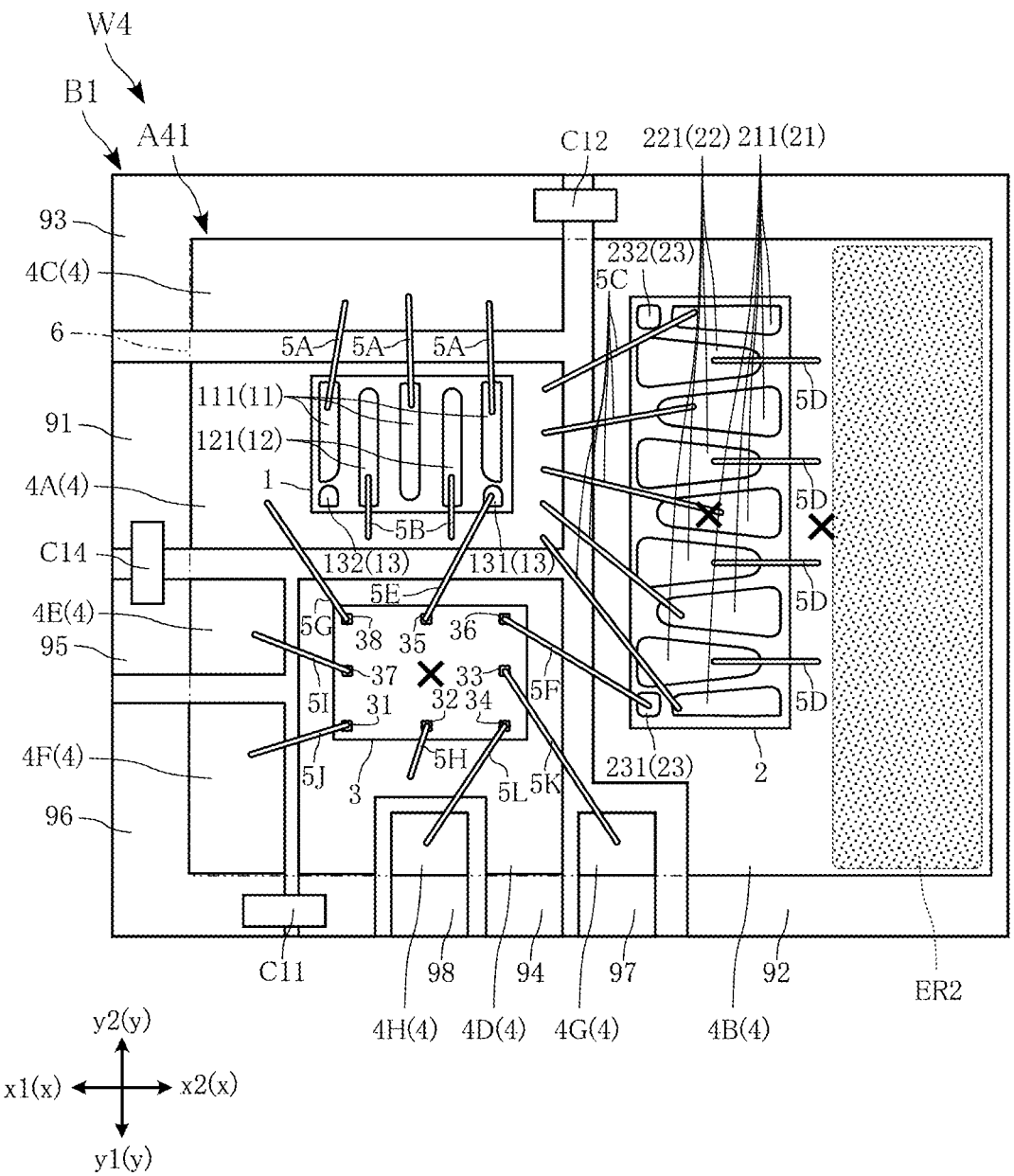
FIG. 17 is a plan view of a power converter according to a variation of the fourth embodiment.

FIG. 17 shows a variation of the semiconductor device A4 according to the fourth embodiment. The semiconductor device A41 according to the present variation is larger in plan view area of the lead 4B than the semiconductor device A4. Specifically, the lead 4B of the semiconductor device A41 (see FIG. 17) has an expanded region ER2 (indicated by dots in FIG. 17 for convenience of understanding) in addition to the area of the lead 4B of the semiconductor device A4 (see FIG. 16).

In the semiconductor device A41, the plan view area of the lead 4B is larger than that of the lead 4B of the semiconductor device A4. Thus, the efficiency of heat transfer from the lead 4B to the wiring pattern 92 of the circuit board B1 is improved. That is, in the semiconductor device A41, the heat from the semiconductor element 2 can be dissipated from both of the element obverse surface 2a and the element reverse surface 2b. In particular, making the plan view area of the lead 4B 1.1 to 5 times the plan view area of the semiconductor element 2 improves the efficiency of heat transfer from the lead 4B to the wiring pattern 92 while preventing an increase in size of the semiconductor device A41.

Moreover, as viewed in plan, the distance between the center of the semiconductor element 2 and the center of the control element 3 is smaller than the distance between the center of the lead 4B and the center of the control element 3, as shown in FIG. 17. For convenience of understanding, in FIG. 17, each of the center of the semiconductor element 2, the center of the lead 4B and the center of the control element 3 as viewed in plan is marked with an X (cross sign). In this way, the semiconductor element 2 is arranged close to the control element 3, as viewed in plan. With such a configuration, the length of the wire 5F can be shortened, so that the parasitic inductance and parasitic resistance of the wire 5F can be reduced.

Figure 18:
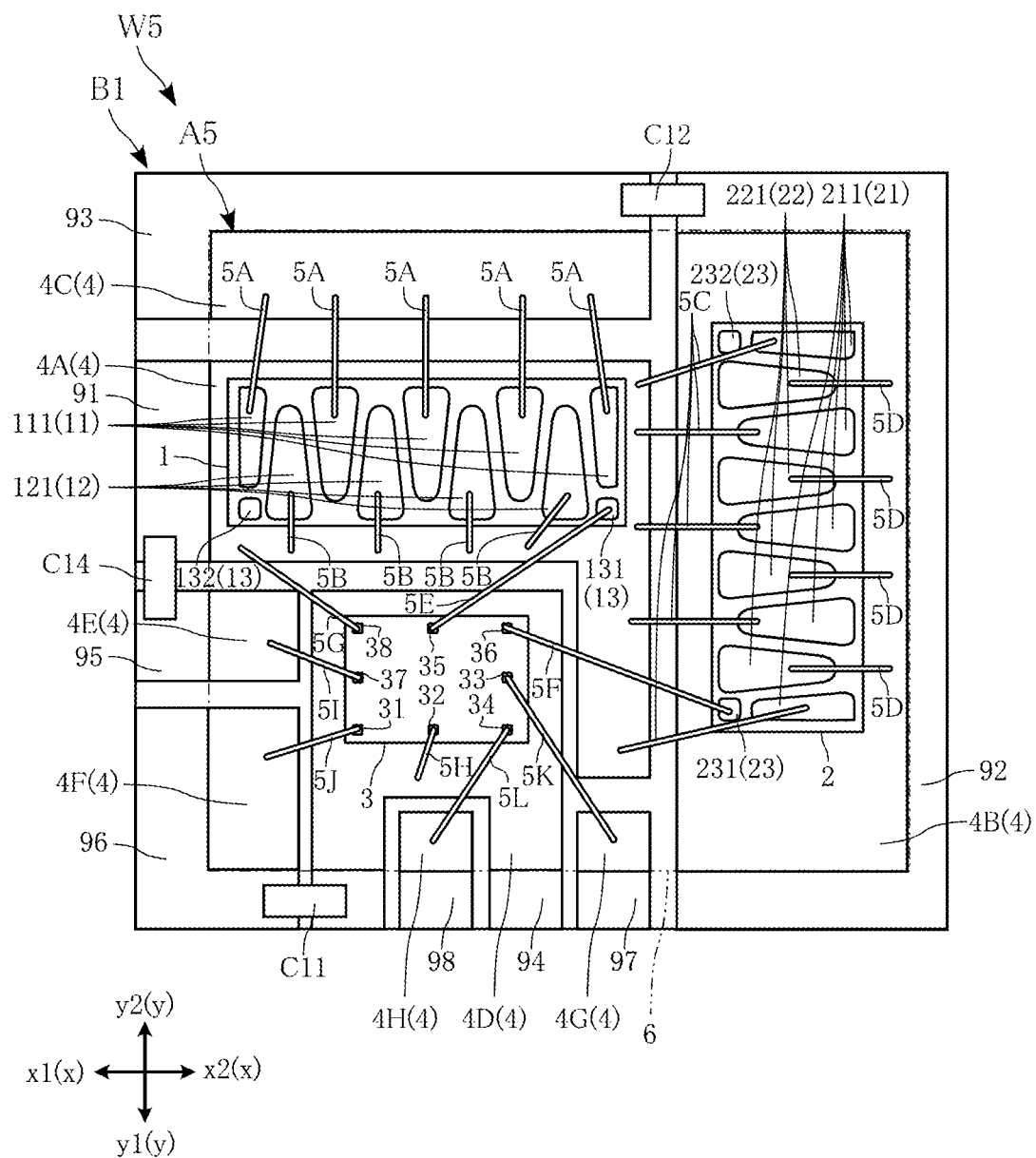
FIG. 18 is a plan view of a power converter according to a fifth embodiment.

A semiconductor device A5 according to a fifth embodiment is described below with reference to FIG. 18. FIG. 18 is a plan view of a power converter W5 provided with the semiconductor device A5, in which the sealing member 6 is shown by imaginary lines (two-dot chain lines).

As shown in FIG. 18, in the semiconductor device A5, the semiconductor element 1 of the semiconductor device A3

(see FIG. 14) and the semiconductor element 2 of the semiconductor device A4 (see FIG. 16) are mounted. That is, the semiconductor elements 1 and 2 of the semiconductor device A5 have a higher performance (e.g., a lower on-resistance) and a larger plan view area than the semiconductor elements 1 and 2 of the semiconductor device A1, respectively. In the semiconductor device A5, the configuration (arrangement, size in plan view, shape, etc.) of each lead 4A-4H of the lead frame 4 is changed as appropriate.

In the semiconductor device A5, as with the semiconductor device A1, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A5 can shorten the wiring of the above-mentioned power system current path. The semiconductor device A5 can thus reduce parasitic inductance and parasitic resistance, and hence achieve higher efficiency and energy savings.

In the semiconductor device A5, semiconductor elements 1 and 2 having a higher performance (e.g., a lower on-resistance) than those of the semiconductor device A1 are mounted. Thus, the semiconductor device A5 can reduce the conduction loss in each of the semiconductor elements 1 and 2, as compared with the semiconductor device A1.

Figure 19:
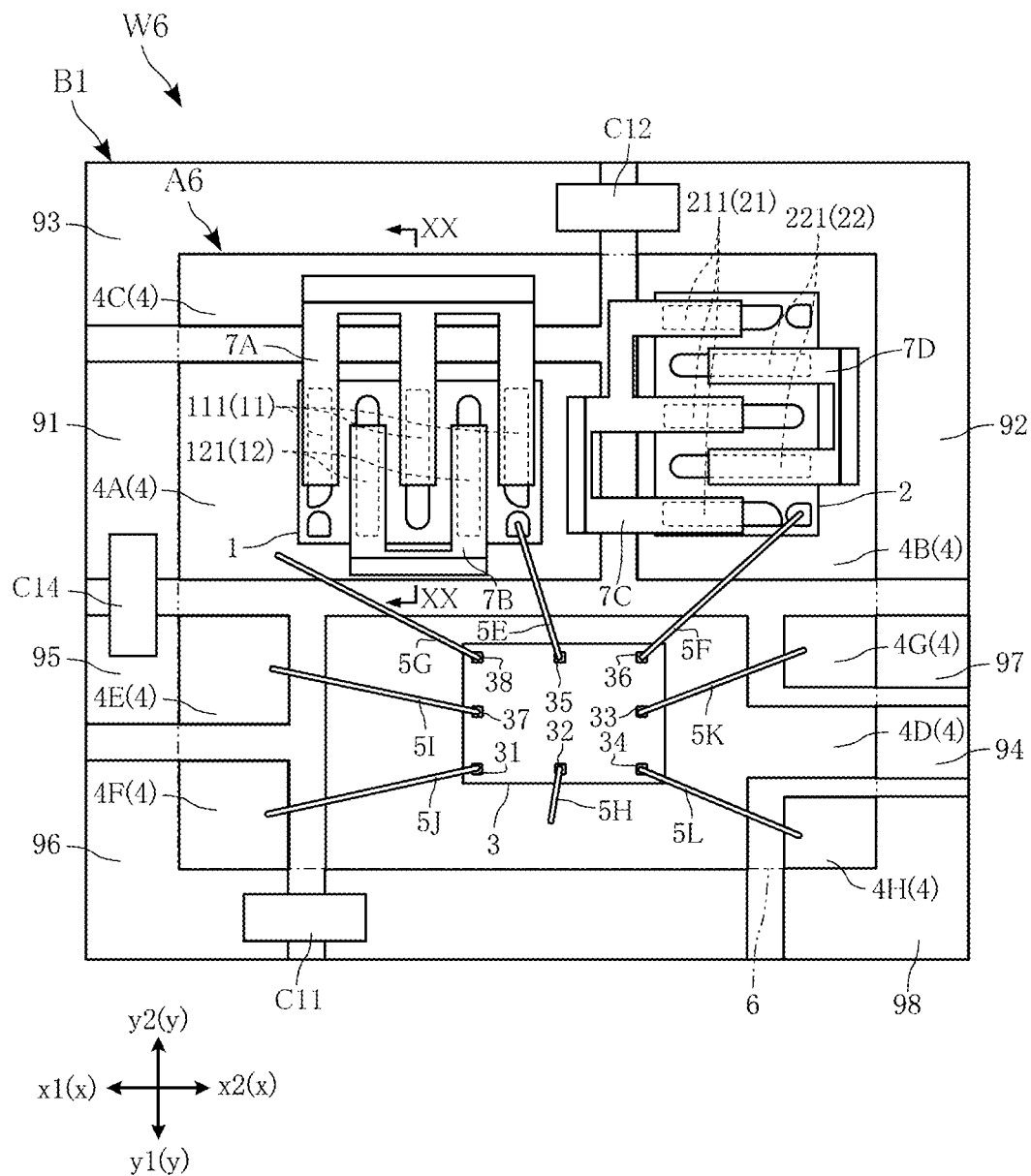
FIG. 19 is a plan view of a power converter according to a sixth embodiment.
Figure 20:
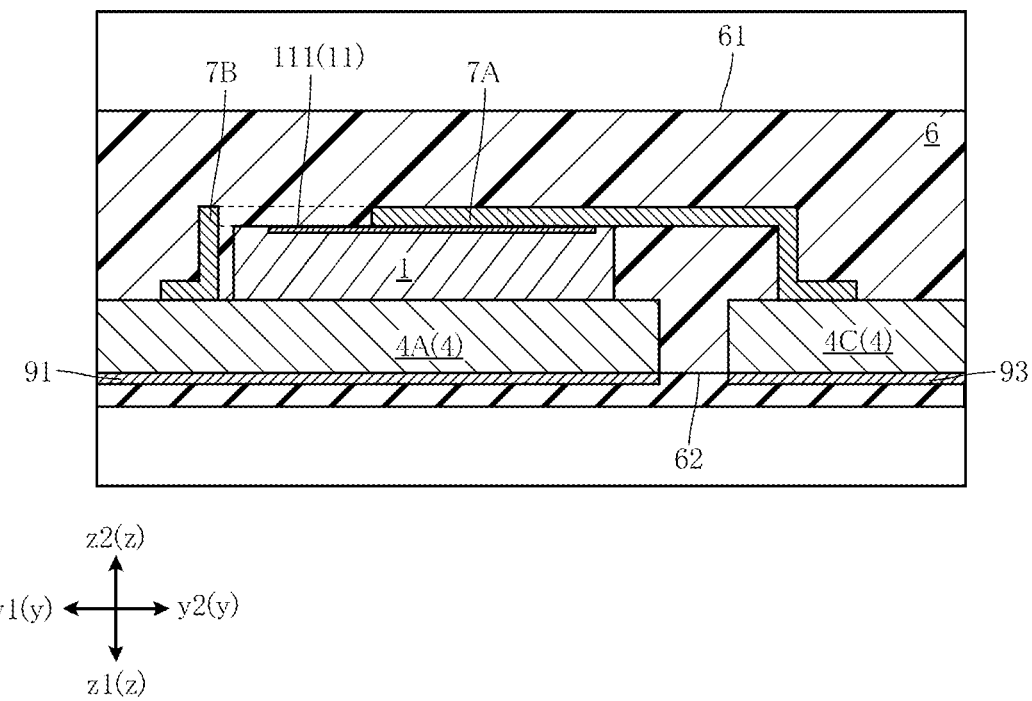
FIG. 20 is a sectional view taken along line XX-XX in FIG. 19.

A semiconductor device A6 according to a sixth embodiment is described below with reference to FIGS. 19 and 20. FIG. 19 is a plan view of a power converter W6 provided with the semiconductor device A6, in which the sealing member 6 is shown by imaginary lines (two-dot chain lines). FIG. 20 is a sectional view taken along line XX-XX in FIG. 19.

As shown in FIG. 19, unlike the semiconductor device A1, the semiconductor device A6 uses clips 7A, 7B, 7C and 7D instead of the wires 5A, 5B, 5C and 5D.

As shown in FIG. 20, each of the clips 7A-7D is formed by bending a plate-like metal member. The clips 7A-7D may be made of a metal containing Cu or a metal containing Al, for example. The material may be a clad material such as CIC (Copper-Invar-Copper). Each of the clips 7A-7D is bent perpendicular to the top surface of the lead frame 4 in the example shown in FIG. 20, but may be inclined with respect to the z direction.

The clip 7A has a comb-like shape on one side in the y direction (y1 side in FIG. 19), and each comb tooth is bonded to a respective one of the pad portions 111. The clip 7B has a comb-like shape on one side in the y direction (y2 side in FIG. 19), and each comb tooth is bonded to a respective one of the pad portions 121. The clip 7C has a comb-like shape on one side in the x direction (x2 side in FIG. 19), and each comb tooth is bonded to a respective one of the pad portions 211. The clip 7D has a comb-like shape on one side in the x direction (x1 side in FIG. 19), and each comb tooth is bonded to a respective one of the pad portions 221. The shape of each clip 7A-7D is not limited to the example shown in FIGS. 19 and 20.

In the semiconductor device A6, as with the semiconductor device A1, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A6 can shorten the wiring of the above-mentioned power system current path. The semiconductor device A6 can thus reduce parasitic inductance and parasitic resistance, and hence achieve higher efficiency and energy savings.

The semiconductor device A6 has the clip 7A instead of the wires 5A. The clip 7A can have a smaller wiring resistance than the wire 5A. In particular, since the clip 7A constitutes a part of the above-mentioned power system current path, the semiconductor device A6 can reduce power loss in power conversion, as compared with the semiconductor device A1. Also, the semiconductor device A6 has clips 7B, 7C and 7D instead of the wires 5B, 5C and 5D. The clips 7B, 7C and 7D can have a smaller wiring resistance than the wires 5B, 5C and 5D, respectively. In particular, since each of the clips 7B, 7C and 7D constitutes a part of the above-mentioned power system current path, the semiconductor device A6 can reduce power loss in power conversion, as compared with the semiconductor device A1.

An example in which each clip 7A-7D is bent at a portion is shown in the sixth embodiment, but the clips 7A-7D are not limited to such a structure. For example, each of the clips 7A-7D may have different thicknesses (i.e., the dimension in the z direction) at different portions. In this case, each of the clips 7A-7D has a smaller thickness at the portion bonded to the semiconductor element 1 or 2 and a larger thickness at the portion bonded to one of the leads 4A, 4B and 4C.

An example in which the clip 7A has comb teeth portions bonded to the pad portions 111 (drain electrode 11) is shown in the sixth embodiment, but the clip 7A is not limited to such a configuration. For example, a plurality of clips 7A each in the form of a strip may be provided, and each of the clips 7A may be bonded to a respective one of the pad portions 111. The same holds true for other clips 7B-7D.

Figure 21:
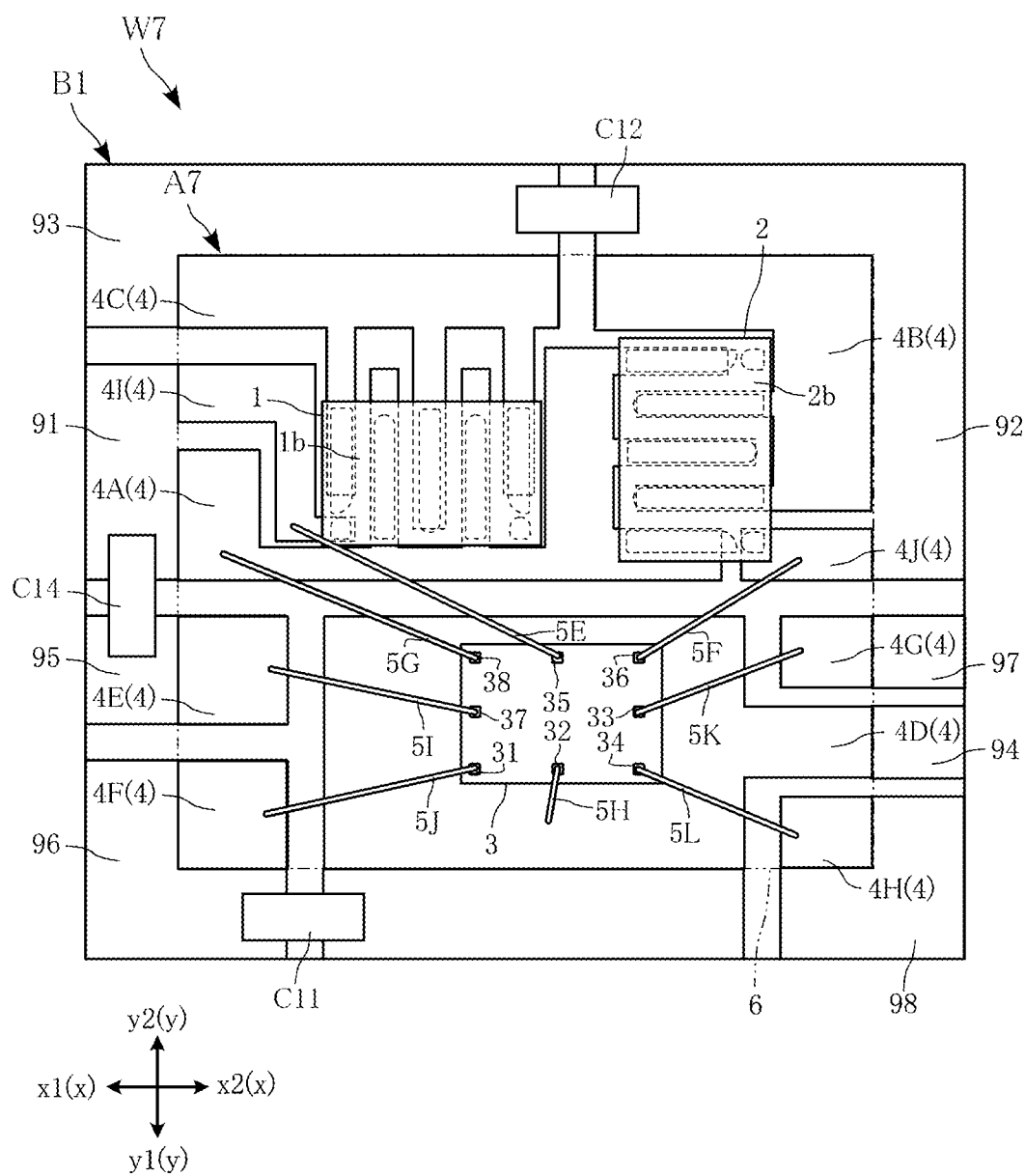
FIG. 21 is a plan view of a power converter according to a seventh embodiment.

A semiconductor device A7 according to a seventh embodiment is described below with reference to FIG. 21. FIG. 21 is a plan view of a power converter W7 provided with the semiconductor device A7, in which the sealing member 6 is shown by imaginary lines (two-dot chain lines).

As shown in FIG. 21, unlike the semiconductor device A1, each of the semiconductor elements 1 and 2 is flip chip mounted in the semiconductor device A7. That is, the semiconductor element 1 is mounted with the element obverse surface 1a facing the lead frame 4, and the semiconductor element 2 is mounted with the element obverse surface 2a facing the lead frame 4.

The lead frame 4 of the semiconductor device A7 includes leads 4A-4C having different shapes adapted for the flip-chip mounting of the semiconductor elements 1 and 2, and additionally includes the leads 4I and 4J. As shown in FIG. 21, each lead 4A-4C is formed with a comb-like portion (hereinafter referred to as "comb portion"). Note that the lead 4A is formed with two comb portions.

As shown in FIG. 21, the drain electrode 11 (pad portions 111) of the semiconductor element 1 is conductively bonded to the comb portion of the lead 4C. The source electrode 12 (pad portions 121) of the semiconductor element 1 is conductively bonded to one of the comb portions of the lead 4A. The gate electrode 13 (one of the two pads 131 and 132) of the semiconductor element 1 is electrically bonded to the lead 4I. The drain electrode 21 (pad portions 211) of the semiconductor element 2 is conductively bonded to the other one of the comb portions of the lead 4A. The source electrode 22 (pad portions 221) of the semiconductor element 2 is conductively bonded to the comb portion of the lead 4B. The gate electrode 23 (one of the two pads 231 and 232) of the semiconductor element 2 is conductively bonded to the lead 4J.

As shown in FIG. 21, the wire 5E is bonded to the lead 4I. The gate electrode 13 of the semiconductor element 1 and the element electrode 35 are electrically connected to each other via the lead 4I and the wire 5E. The wire 5F is bonded to the lead 4J. The gate electrode 23 of the semiconductor element 2 and the element electrode 36 of the control element 3 are electrically connected to each other via the lead 4J and the wire 5F.

In the semiconductor device A7 again, the lead 4A and the lead 4B are adjacent to each other in the x direction as viewed in the z direction, and the lead 4C is adjacent to each of the lead 4A and the lead 4B as viewed in the z direction. Thus, as with the semiconductor device A1, the semiconductor device A7 can shorten the wiring of the above-mentioned power system current path. The semiconductor device A7 can thus reduce parasitic inductance and parasitic resistance, and hence achieve higher efficiency and energy savings.

Figure 22:
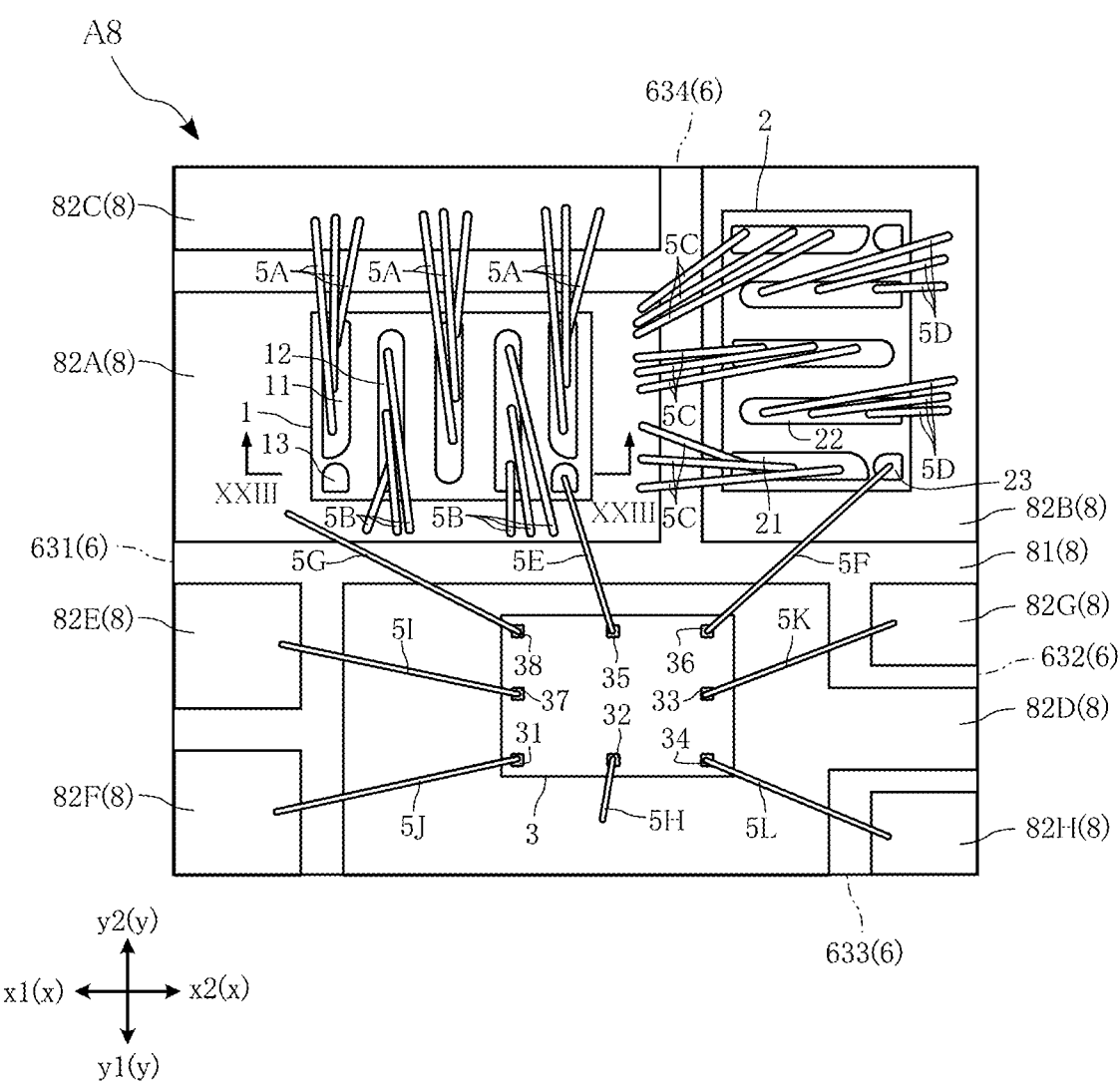
FIG. 22 is a plan view of a power converter according to an eighth embodiment.
Figure 23:
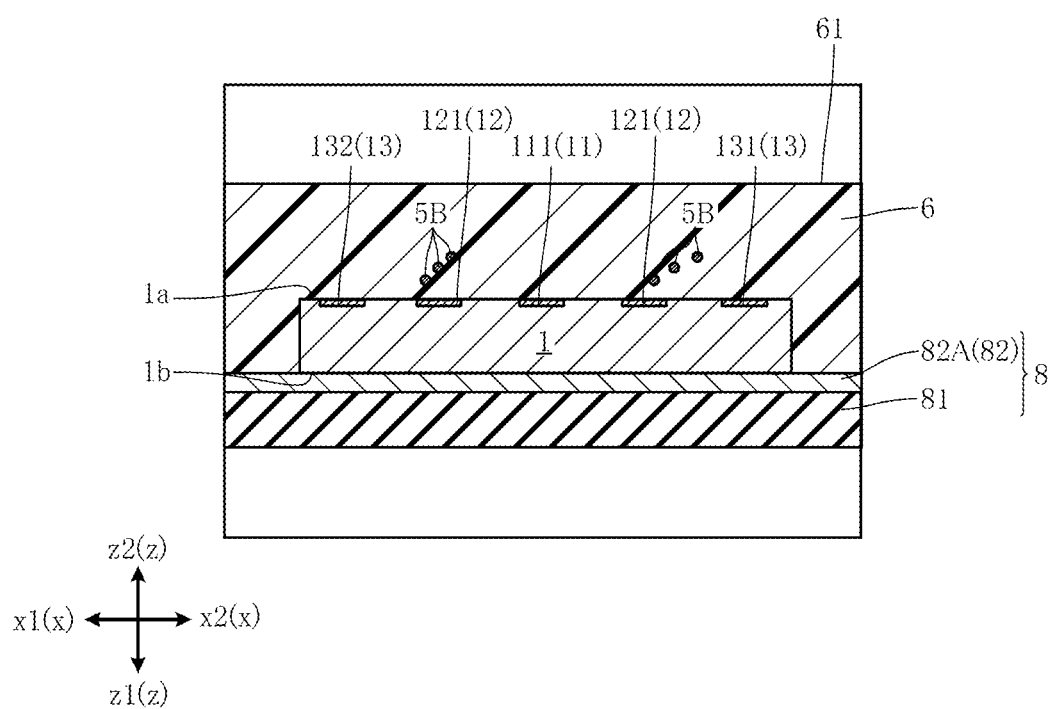
FIG. 23 is a sectional view taken along line XXIII-XXIII in FIG. 22.

A semiconductor device A8 according to an eighth embodiment is described below with reference to FIGS. 22 and 23. FIG. 22 is a plan view of the semiconductor device A8, in which the sealing member 6 is shown by imaginary lines (two-dot chain lines). FIG. 23 is a sectional view taken along line XXIII-XXIII in FIG. 22.

As shown in FIGS. 22 and 23, unlike the semiconductor device A1, the semiconductor device A8 has a conductive substrate 8 instead of the lead frame 4.

The conductive substrate 8 includes a base 81 and a plurality of wiring portions 82A-82H.

The base 81 is made of an insulating material. The material for the base 81 may be a ceramic material with a high thermal conductivity. Examples of such a ceramic material include AlN (aluminum nitride), SiN (silicon nitride), and $Al_2O_3$ (aluminum oxide). The base 81 is in the form of a flat plate, for example. The material for the base 81 is not limited to a ceramic material and may be various resin materials used for printed circuit boards, or silicon, for example.

The wiring portions 82A-82H are formed on the base 81. The wiring portions 82A-82H are made of a conductive material. The material for the wiring portions 82A-82H may be a metal containing copper, for example. Note that the material may not be copper but may be aluminum, for example. The wiring portions 82A-82H are spaced apart from each other.

The wiring portion 82A corresponds to the lead 4A. The wiring portion 82B corresponds to the lead 4B. The wiring portion 82C corresponds to the lead 4C. The wiring portion 82D corresponds to the lead 4D. The wiring portion 82E corresponds to the lead 4E. The wiring portion 82F corresponds to the lead 4F. The wiring portion 82G corresponds to the lead 4G. The wiring portion 82H corresponds to the lead 4H. The wiring portions 82A-82H shown in FIG. 22 are arranged in the same manner as the leads 4A-4H of the semiconductor device A1, and their positional relationships are also the same.

In the present embodiment, the conductive substrate 8 may correspond to the "conductive member" recited in the claims. The wiring portion 82A may correspond to the "first conductor" recited in the claims. The wiring portion 82B may correspond to the "second conductor" recited in the claims. The wiring portion 82C may correspond to the "third conductor" recited in the claims. The wiring portion 82D may correspond to the "fourth conductor" recited in the claims. The wiring portion 82E may correspond to the "fifth conductor" recited in the claims. The wiring portion 82F may correspond to the "sixth conductor" recited in the claims. The wiring portion 82G may correspond to the "seventh conductor" recited in the claims. The wiring portion 82H may correspond to the "eighth conductor" recited in the claims.

The semiconductor device A8 has wiring portions 82A, 82B and 82C arranged in the same manner as the leads 4A, 4B and 4C of the semiconductor device A1, respectively. In the semiconductor device A8 having such a configuration, as with the semiconductor device A1, the wiring portion 82A and the wiring portion 82B are adjacent to each other in the x direction as viewed in the z direction, and the wiring portion 82C is adjacent to each of the wiring portion 82A and the wiring portion 82B as viewed in the z direction. Thus, as with the semiconductor device A1, the semiconductor device A8 can shorten the wiring of the above-mentioned power system current path. The semiconductor device A8 can thus reduce parasitic inductance and parasitic resistance, and hence achieve higher efficiency and energy savings.

In the first through eighth embodiments, a case is shown where each semiconductor device A1-A8 is of a SON package type. However, the semiconductor devices A1-A8 are not limited to such a package type and may be configured in other package types. For example, the semiconductor devices may be configured in package types such as a BGA (Ball Grid Array) type, LGA (Land Grid Array) type, QFP (Quad Flat Package) type or QFN (Quad Flat Non-lead) type. The above package types are merely examples and not limitative.

The semiconductor device according to the present disclosure is not limited to the embodiments described above. The specific structure of each part of the semiconductor device according to the present disclosure may be varied in design in many ways.

The semiconductor device according to the present disclosure includes the embodiments described in the following clauses.

Clause 1.

A semiconductor device comprising:

a conductive member including a first conductor, a second conductor and a third conductor that are spaced apart from each other;

a first semiconductor element having a first obverse surface on which a first drain electrode, a first source electrode and a first gate electrode are disposed; and a second semiconductor element having a second obverse surface on which a second drain electrode, a second source electrode and a second gate electrode are disposed, wherein the first conductor is electrically connected to the first source electrode and the second drain electrode, the second conductor is electrically connected to the second source electrode, and as viewed in a first direction orthogonal to the first obverse surface, the second conductor is adjacent to the first conductor in a second direction orthogonal to the first direction, and the third conductor is electrically connected to the first drain electrode and is adjacent to each of the first conductor and the second conductor as viewed in the first direction.

Clause 2.

The semiconductor device according to clause 1, further comprising:

a first connection member that electrically connects the third conductor and the first drain electrode;

a second connection member that electrically connects the first source electrode and the first conductor;

a third connection member that electrically connects the first conductor and the second drain electrode; and a fourth connection member that electrically connects the second source electrode and the second conductor, wherein the first semiconductor element is mounted on the first conductor, with the first obverse surface facing away from the first conductor in the first direction, and the second semiconductor element is mounted on the second conductor, with the second obverse surface facing away from the second conductor in the first direction.

Clause 3.

The semiconductor device according to clause 2, wherein as viewed in the first direction, the first conductor and the third conductor are adjacent to each other in a third direction orthogonal to both of the first direction and the second direction.

Clause 4.

The semiconductor device according to clause 3, wherein as viewed in the first direction, the first connection member overlaps with a first insulating region that insulates the first conductor and the third conductor form each other.

Clause 5.

The semiconductor device according to clause 3 or 4, wherein as viewed in the first direction, the third connection member overlaps with a second insulating region that insulates the first conductor and the second conductor form each other.

Clause 6.

The semiconductor device according to any of clauses 3-5, wherein the first conductor and the second conductor overlap with each other as viewed in the second direction, and the first conductor and the third conductor overlap with each other as viewed in the third direction.

Clause 7.

The semiconductor device according to clause 6, wherein the second conductor and the third conductor overlap with each other as viewed in the second direction.

Clause 8.

The semiconductor device according to any of clauses 3-7, further comprising:

a control element including a first element electrode and a second element electrode;

a fifth connection member that electrically connects the first gate electrode and the first element electrode; and a sixth connection member that electrically connects the second gate electrode and the second element electrode, wherein the control element outputs from the first element electrode a first drive signal that controls a switching operation of the first semiconductor element and outputs from the second element electrode a second drive signal that controls a switching operation of the second semiconductor.

Clause 9.

The semiconductor device according to clause 8, wherein the conductive member further includes a fourth conductor which is spaced apart from the first conductor, the second conductor and the third conductor and on which the control element is mounted, and the fourth conductor overlaps with the first conductor and the third conductor as viewed in the third direction and is located on an opposite side of the third conductor with respect to the first conductor in the third direction.

Clause 10.

The semiconductor device according to clause 9, wherein the fifth connection member overlaps with only the first conductor and the fourth conductor of the conductive member, as viewed in the first direction.

Clause 11.

The semiconductor device according to clause 9 or 10, wherein the sixth connection member overlaps with only the second conductor and the fourth conductor of the conductive member, as viewed in the first direction.

Clause 12.

The semiconductor device according to any of clauses 9-11, further comprising:

a first capacitor having two terminals, wherein one of the terminals of the first capacitor is bonded to the second conductor and the other terminal is bonded to the third conductor.

Clause 13.

The semiconductor device according to any of clauses 9-12, further comprising:

a second capacitor having two terminals, wherein the conductive member further includes a fifth conductor spaced apart from the first conductor, the second conductor, the third conductor and the fourth conductor and electrically connected to the control element, and one of the terminals of the second capacitor is bonded to the first conductor and the other terminal is bonded to the fifth conductor.

Clause 14.

The semiconductor device according to any of clauses 9-13, further comprising:

a third capacitor having two terminals, wherein the conductive member further includes a sixth conductor spaced apart from the first conductor, the second conductor, the third conductor and the fourth conductor and electrically connected to the control element, and one of the terminals of the third capacitor is bonded to the fourth conductor and the other terminal is bonded to the sixth conductor.

Clause 15.

The semiconductor device according to any of clauses 9-14, further comprising:

a fourth capacitor and a fifth capacitor each having two terminals, wherein the conductive member further includes a seventh conductor and an eighth conductor each spaced apart from the first conductor, the second conductor, the third conductor and the fourth conductor, the seventh conductor and the eighth conductor are spaced apart from each other and each electrically connected to the control element, one of the terminals of the fourth capacitor is bonded to the fourth conductor and the other terminal is bonded to the seventh conductor, and the fifth capacitor is bonded to the fourth conductor and the other terminal is bonded to the eighth conductor.

Clause 16.

The semiconductor device according to any of clauses 9-15, further comprising:

a sixth capacitor having two terminals, wherein one of the terminals of the sixth capacitor is bonded to the second conductor and the other terminal is bonded to the fourth conductor.

Clause 17.

The semiconductor device according to any of clauses 9-16, wherein an on-resistance of the first semiconductor element is lower than an on-resistance of the second semiconductor element.

Clause 18.

The semiconductor device according to any of clauses 9-16, wherein an on-resistance of the second semiconductor element is lower than an on-resistance of the first semiconductor element.

Clause 19.

The semiconductor device according to any of clauses 9-18, wherein as viewed in the first direction, a distance between a center of the first semiconductor element and a center of the control element is smaller than a distance between a center of the first conductor and the center of the control element.

Clause 20.

The semiconductor device according to any of clauses 9-19, wherein as viewed in the first direction, a distance between a center of the second semiconductor element and a center of the control element is smaller than a distance between a center of the second conductor and the center of the control element.

Clause 21.

The semiconductor device according to any of clauses 9-20, wherein the second conductor overlaps with the fourth conductor as viewed in the second direction.

Clause 22.

The semiconductor device according to any of clauses 1-21, wherein the first drain electrode includes a plurality of first drain pad portions each extending in a first extension direction orthogonal to the first direction, the first source electrode includes a plurality of first source pad portions each extending in the first extension direction, and the first drain pad portions and the first source pad portions are alternately arranged in a first arrangement direction orthogonal to both of the first direction and the first extension direction.

Clause 23.

The semiconductor device according to clause 22, wherein the second drain electrode includes a plurality of second drain pad portions each extending in a second extension direction orthogonal to the first direction, the second source electrode includes a plurality of second source pad portions each extending in the second extension direction, the second drain pad portions and the second source pad portions are alternately arranged in a second arrangement direction orthogonal to both of the first direction and the second extension direction, and the second extension direction is inclined with respect to the first extension direction.

Clause 24.

The semiconductor device according to clause 23, wherein an inclination of the second extension direction with respect to the first extension direction is not less than 10° and not more than 170°.

Clause 25.

The semiconductor device according to any of clauses 1-24, wherein each of the first semiconductor element and the second semiconductor element is made of gallium nitride.

LIST OF REFERENCE CHARACTERS

A1-A8, A31, A41: Semiconductor device
1, 2: Semiconductor element
1a, 2a: Element obverse surface
1b, 2b: Element reverse surface
11, 21: Drain electrode
111, 211: Pad portion
12, 22: Source electrode
122, 211: Pad portion
13, 23: Gate electrode
131, 132, 231, 232: Pad portion
3: Control element
3a: Element obverse surface
3b: Element reverse surface
31-38: Element electrode
4: Lead frame
4A-4J: Lead
49A, 49B, 49C: Insulating region
5A-5L: Wire
6: Sealing member
61: Resin obverse surface
62: Resin reverse surface
631-634: Resin side surface
7A-7D: Clip
8: Conductive substrate
81: Base
82A-82H: Wiring portion
W1-W7: Power converter
B1: Circuit board
91-98, 971, 981: Wiring pattern
C11-C14, C21, C22, C24-C27: Capacitor
R15, R16: Resistor
D1: Diode
DR1, DR2: Drive circuit
ER1, ER2: Expanded region
GND1: First ground
GND2: Second ground
L1: Inductor
LO: Load
PS1, PS2: External power supply
T1-T8: External terminal
TC1-TC8: Connection terminal

The invention claimed is:

1. A semiconductor device comprising:
a conductive member including a first conductor, a second conductor and a third conductor that are spaced apart from each other;
a first semiconductor element having a first obverse surface on which a first drain electrode, a first source electrode and a first gate electrode are disposed; and
a second semiconductor element having a second obverse surface on which a second drain electrode, a second source electrode and a second gate electrode are disposed, wherein the first conductor is electrically connected to the first source electrode and the second drain electrode,
the second conductor is electrically connected to the second source electrode, and as viewed in a first direction orthogonal to the first obverse surface, the second conductor is adjacent to the first conductor in a second direction orthogonal to the first direction, and
the third conductor is electrically connected to the first drain electrode and is adjacent to each of the first conductor and the second conductor as viewed in the first direction.

2. The semiconductor device according to claim 1, further comprising:
a first connection member that electrically connects the third conductor and the first drain electrode;
a second connection member that electrically connects the first source electrode and the first conductor;
a third connection member that electrically connects the first conductor and the second drain electrode; and
a fourth connection member that electrically connects the second source electrode and the second conductor, wherein the first semiconductor element is mounted on the first conductor, with the first obverse surface facing away from the first conductor in the first direction, and the second semiconductor element is mounted on the second conductor, with the second obverse surface facing away from the second conductor in the first direction.

3. The semiconductor device according to claim 2, wherein as viewed in the first direction, the first conductor and the third conductor are adjacent to each other in a third direction orthouonal to both of the first direction and the second direction.

4. The semiconductor device according to claim 3, wherein as viewed in the first direction, the first connection member overlaps with a first insulating region that insulates the first conductor and the third conductor form each other.

5. The semiconductor device according to claim 3, wherein as viewed in the first direction, the third connection member overlaps with a second insulating region that insulates the first conductor and the second conductor form each other.

6. The semiconductor device according to claim 3, wherein
the first conductor and the second conductor overlap with each other as viewed in the second direction, and
the first conductor and the third conductor overlap with each other as viewed in the third direction.

7. The semiconductor device according to claim 6, wherein the second conductor and the third conductor overlap with each other as viewed in the second direction.

8. The semiconductor device according to claim 3, further comprising:
a control element including a first element electrode and a second element electrode;
a fifth connection member that electrically connects the first uate electrode and the first element electrode; and
a sixth connection member that electrically connects the second gate electrode and the second element electrode, wherein
the control element outputs from the first element electrode a first drive signal that controls a switching operation of the first semiconductor element and outputs from the second element electrode a second drive signal that controls a switching operation of the second semiconductor.

9. The semiconductor device according to claim 8, wherein
the conductive member further includes a fourth conductor which is spaced apart from the first conductor, the second conductor and the third conductor and on which the control element is mounted, and
the fourth conductor overlaps with the first conductor and the third conductor as viewed in the third direction and is located on an opposite side of the third conductor with respect to the first conductor in the third direction.

10. The semiconductor device according to claim 9, wherein the fifth connection member overlaps with only the first conductor and the fourth conductor of the conductive member, as viewed in the first direction.

11. The semiconductor device according to claim 9, wherein the sixth connection member overlaps with only the second conductor and the fourth conductor of the conductive member, as viewed in the first direction.

12. The semiconductor device according to claim 9, further comprising:
a first capacitor having two terminals,
wherein one of the terminals of the first capacitor is bonded to the second conductor and the other terminal is bonded to the third conductor.

13. The semiconductor device according to claim 9, further comprising:
a second capacitor having two terminals, wherein
the conductive member further includes a fifth conductor spaced apart from the first conductor, the second conductor, the third conductor and the fourth conductor and electrically connected to the control element, and
one of the terminals of the second capacitor is bonded to the first conductor and the other terminal is bonded to the fifth conductor.

14. The semiconductor device according to claim 9, further comprising:
a third capacitor having two terminals, wherein
the conductive member further includes a sixth conductor spaced apart from the first conductor, the second conductor, the third conductor and the fourth conductor and electrically connected to the control element, and
one of the terminals of the third capacitor is bonded to the fourth conductor and the other terminal is bonded to the sixth conductor.

15. The semiconductor device according to claim 9, further comprising:
a fourth capacitor and a fifth capacitor each having two terminals, wherein
the conductive member further includes a seventh conductor and an eighth conductor each spaced apart from the first conductor, the second conductor, the third conductor and the fourth conductor,
the seventh conductor and the eighth conductor are spaced apart from each other and each electrically connected to the control element,
one of the terminals of the fourth capacitor is bonded to the fourth conductor and the other terminal is bonded to the seventh conductor, and
the fifth capacitor is bonded to the fourth conductor and the other terminal is bonded to the eighth conductor.

16. The semiconductor device according to claim 9, further comprising:
a sixth capacitor having two terminals, wherein
one of the terminals of the sixth capacitor is bonded to the second conductor and the other terminal is bonded to the fourth conductor.

17. The semiconductor device according to claim 9, wherein an on-resistance of the first semiconductor element is lower than an on- resistance of the second semiconductor element.

18. The semiconductor device according to claim 9, wherein an on-resistance of the second semiconductor element is lower than an on- resistance of the first semiconductor element.

19. The semiconductor device according to claim 9, wherein as viewed in the first direction, a distance between a center of the first semiconductor element and a center of the control element is smaller than a distance between a center of the first conductor and the center of the control element.

20. The semiconductor device according to claim 9, wherein as viewed in the first direction, a distance between a center of the second semiconductor element and a center of the control element is smaller than a distance between a center of the second conductor and the center of the control element.

21. The semiconductor device according to claim 9, wherein the second conductor overlaps with the fourth conductor as viewed in the second direction.

22. The semiconductor device according to claim 1, wherein
the first drain electrode includes a plurality of first drain pad portions each extending in a first extension direction orthogonal to the first direction,
the first source electrode includes a plurality of first source pad portions each extending in the first extension direction, and
the first drain pad portions and the first source pad portions are alternately arranged in a first arrangement direction orthogonal to both of the first direction and the first extension direction.

23. The semiconductor device according to claim 22, wherein
the second drain electrode includes a plurality of second drain pad portions each extending in a second extension direction orthogonal to the first direction,
the second source electrode includes a plurality of second source pad portions each extending in the second extension direction,
the second drain pad portions and the second source pad portions are alternately arranged in a second arrangement direction orthogonal to both of the first direction and the second extension direction, and
the second extension direction is inclined with respect to the first extension direction.

24. The semiconductor device according to claim 23, wherein an inclination of the second extension direction with respect to the first extension direction is not less than 10° and not more than 170°.

25. The semiconductor device according to claim 1, wherein each of the first semiconductor element and the second semiconductor element is made of uallium nitride.

* * * * *